United States Patent
Berg et al.

(10) Patent No.: US 10,184,686 B2
(45) Date of Patent: Jan. 22, 2019

(54) SYSTEM FOR MAINTAINING A POLLUTANT CONTROLLED WORKSPACE

(71) Applicant: Carpe Diem Technologies, Inc., Franklin, MA (US)

(72) Inventors: John S. Berg, Franklin, MA (US); Dimitur Benchev, Norwood, MA (US); Nicole Elizabeth Blackburn, Fall River, MA (US)

(73) Assignee: CARPE DIEM TECHNOLOGIES, INC., Franklin, MA (US)

( * ) Notice: Subject to any disclaimer, the term of this patent is extended or adjusted under 35 U.S.C. 154(b) by 96 days.

(21) Appl. No.: 15/011,967

(22) Filed: Feb. 1, 2016

(65) Prior Publication Data

US 2016/0223220 A1 Aug. 4, 2016

Related U.S. Application Data

(60) Provisional application No. 62/110,492, filed on Jan. 31, 2015.

(51) Int. Cl.
| | |
|---|---|
| *B08B 15/02* | (2006.01) |
| *F24F 13/28* | (2006.01) |
| *F24F 3/16* | (2006.01) |
| *H01L 21/67* | (2006.01) |
| *F24F 110/64* | (2018.01) |

(52) U.S. Cl.
CPC ............ *F24F 13/28* (2013.01); *B08B 15/023* (2013.01); *F24F 3/1607* (2013.01); *H01L 21/67017* (2013.01); *H01L 21/67173* (2013.01); *F24F 2110/64* (2018.01); *Y02A 50/25* (2018.01); *Y02B 30/78* (2013.01)

(58) Field of Classification Search
CPC ............ B08B 15/023; B08B 2215/003; F24F 3/1607; F24F 3/16; Y10S 55/29; Y10S 55/18
USPC ................. 55/473, 385.2, DIG. 18, DIG. 29; 454/56, 57, 187
See application file for complete search history.

(56) References Cited

U.S. PATENT DOCUMENTS

| | | | | |
|---|---|---|---|---|
| 3,318,076 A | * | 5/1967 | Baker .................. | B08B 15/023 454/56 |
| 3,364,838 A | * | 1/1968 | Bradley ................. | A47B 81/00 165/80.3 |

(Continued)

*Primary Examiner* — Duane Smith
*Assistant Examiner* — Minh Chau T Pham
(74) *Attorney, Agent, or Firm* — Kriegsman & Kriegsman

(57) ABSTRACT

A system for maintaining a pollutant controlled workspace includes an airtight enclosure with a front access window. A set of impermeable exterior panels and a set of permeable interior panels are slidably mounted within the access window in a spaced apart relationship. Regulated either through a manual control panel or programmable controller, a fan filter unit treats a supply of source air and delivers the filtered air down into a narrow vertical airflow channel located between the exterior and interior panels. Once a suitable amount of pressure accumulates, the treated air penetrates into the workspace as a horizontal laminar flow. Any particulates present in the workspace are drawn rearward by the laminar flow and are trapped behind a multi-apertured back board. The contaminant air is then drawn from a low pressure return located behind the back board and into the fan filter unit for recirculation within the enclosure.

15 Claims, 16 Drawing Sheets

(56) References Cited

U.S. PATENT DOCUMENTS

| | | | | |
|---|---|---|---|---|
| 4,792,345 A * | 12/1988 | Abe | F24F 3/1603 | 55/467 |
| 4,832,717 A * | 5/1989 | Peters | B08B 15/023 | 454/187 |
| 4,927,438 A * | 5/1990 | Mears | F24F 3/1607 | 454/56 |
| 5,858,041 A * | 1/1999 | Luetkemeyer | B01D 46/0041 | 55/385.2 |
| 6,632,260 B1 * | 10/2003 | Siemers | B01D 46/0013 | 454/184 |
| 6,660,070 B2 * | 12/2003 | Chung | B01D 46/008 | 55/385.2 |
| 7,854,229 B2 * | 12/2010 | Sadir | A61G 11/00 | 128/202.12 |
| 8,163,052 B2 * | 4/2012 | Ono | A47B 9/00 | 454/56 |
| 8,603,217 B2 * | 12/2013 | Sukhman | B01D 53/04 | 55/338 |
| 9,505,043 B2 * | 11/2016 | Liebsch | B08B 15/023 | |
| 2003/0150328 A1 * | 8/2003 | Hansson | A61G 13/108 | 95/273 |
| 2004/0107679 A1 * | 6/2004 | Ono | B01L 1/04 | 55/385.2 |
| 2005/0217223 A1 * | 10/2005 | Ryan | B01L 1/50 | 55/385.2 |
| 2008/0278042 A1 * | 11/2008 | McCarthy | B01D 46/0091 | 312/209 |
| 2013/0061567 A1 * | 3/2013 | Kawasaki | B01L 1/04 | 55/385.2 |

\* cited by examiner

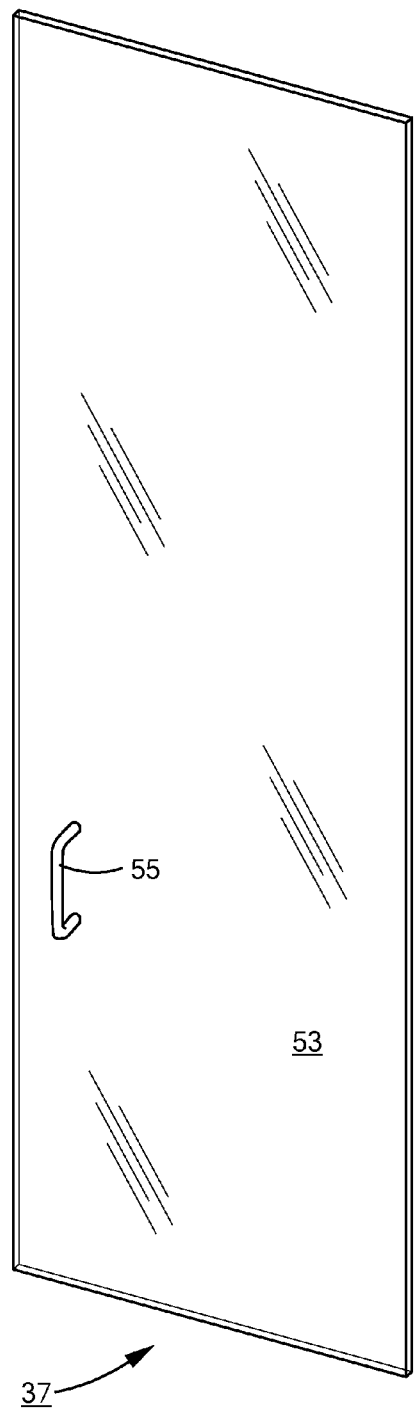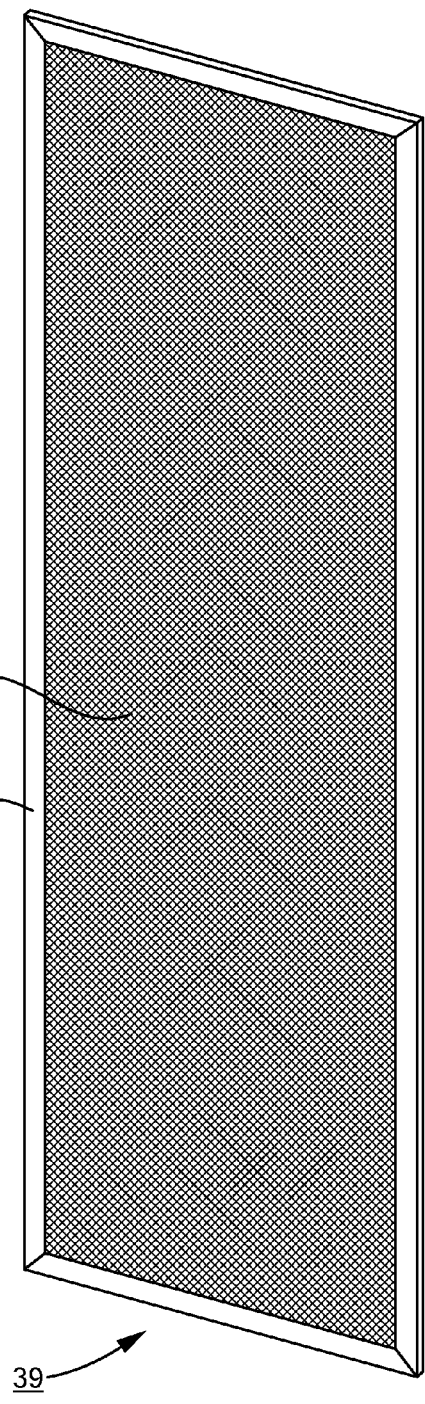
*FIG. 7*  *FIG. 8*

SYSTEM FOR MAINTAINING A POLLUTANT CONTROLLED WORKSPACE

FIELD OF THE INVENTION

The present invention relates generally to the fabrication of products that are highly sensitive to the presence of particulates and, more particularly, to enclosed systems that are designed to maintain a pollutant controlled, or clean, workspace suitable for the fabrication of such products.

BACKGROUND OF THE INVENTION

In the manufacture of extremely fine detailed structures, a workspace is typically required that has a low level of environmental pollutants, such as dust, microbes or chemical vapors. For instance, in the fabrication of certain semiconductor devices, optical components and pharmaceutical products, the presence of particulates as small as one micron can cause considerable defects, since the size of the product that is being produced may be comparable, or even significantly smaller, in size.

To minimize the risk of particulate contamination, sensitive products are commonly manufactured within a pollutant controlled system. As defined herein, the term "pollutant controlled system" encompasses various types of enclosed constructs that are designed to create a clean, low particulate workspace and includes, but is not limited to, (i) smaller, bench-mountable hoods, each typically constructed as a multi-sided enclosure with an enlarged front opening, (ii) larger inflatable canopies, or tents, each typically constructed with a free-standing frame covered with fabric walls, and (iii) entire rooms, or cleanrooms, within a manufacturing facility into which multiple technicians can comfortably enter and perform requisite tasks.

Pollutant controlled systems of the type as described above are typically classified in efficiency by measuring the number of certain sized particles per cubic foot of air. A particle counter is a light-scattering instrument that is commonly used to measure the concentration of airborne particles at designated sampling locations within a tested workspace.

For perspective, an ordinary room in an untreated manufacturing facility can contain at least as many as 1,000,000 particles of at least 0.5 micron size per cubic meter of air. A workspace with this particle count is commonly referred to in the art as a Class 1,000,000, or ISO 9, standard workspace.

By contrast, pollutant controlled workspaces can often achieve considerably lower particle counts. For instance, a Class 1,000, or ISO 6, standard workspace contains no greater than 1,000 particles of at least 0.5 micron size per cubic meter of air. Additionally, a Class 100, or ISO 5, standard workspace contains no greater than 100 particles of at least 0.5 micron size per cubic meter of air. Further, a Class 1, or ISO 3, standard workspace contains no greater than a single particle of at least 0.5 micron size per cubic meter of air. As can be appreciated, maintaining a fabrication workspace with limited particle counts as set forth above has been found to considerably improve product yields.

Regardless of its size and/or construct, pollutant controlled systems often rely upon a downward, laminar flow or air that is produced by at least one fan filter unit disposed directly above the intended workspace (e.g. in the ceiling of a cleanroom). For instance, referring now to FIG. 1, there is shown a simplified section view of a conventional pollutant controlled system 11 that maintains a low particulate workspace 13 using a downward, laminar flow of clean air.

As can be seen, system 11 includes a cabinet-like enclosure 15 comprising a plurality of walls, or panels, 17 that together define clean workspace 13. A fan filter unit 19 is mounted in the top of enclosure 15 and includes a fan, or blower, 21 disposed above at least one filter 23 that is designed to remove at least 99.97% of particles greater than 0.3 micron in size.

In use, blower 21 continuously drives source air 25 through filter 23 to yield clean, or treated, air 27. As part of the design of fan filter unit 19, clean air 27 is blown vertically downward through workspace 13 as a disperse laminar flow. This laminar air flow pushes any airborne particles 29 present within workspace 13 vertically downward. The trapped, contaminated air is then either treated or extracted entirely from workspace 13 through a vent, or outlet, 31 located in a lower region of enclosure 15.

As can be appreciated, the larger size of the designated clean workspace, the greater the volume of clean air that must be routinely treated and cycled therethrough. For this reason, it has been found to be considerably less expensive to create and maintain clean workspaces of smaller volumes. Accordingly, it is often desirable to customize an enclosure for a pollutant controlled system that is slightly larger than the particle sensitive process or machine for which it is intended.

Pollutant controlled systems that rely upon a downward, laminar air flow have been found to suffer from a couple notable shortcomings.

As a first shortcoming, pollutant controlled systems that rely upon a downward, laminar flow have been found to be ineffective when the workspace is populated with one or more horizontally disposed elements (e.g. tables, shelves or sections of a continuous flexible substrate, or web, driven horizontally by rollers through different treatment stations). Specifically, downward displacement of debris across horizontal elements creates circulation issues within the workspace. As a result, areas of poor, or stagnant, air circulation are created immediately beneath each horizontal element and, as such, produce regions in which particulates accumulate. Additionally, the presence of horizontal elements causes turbulence in the clean air flow, resulting in the pressurization and swirling of particles throughout the workspace. Accordingly, particulates present throughout the workspace can eventually fall by gravity or be attracted electrostatically onto potentially sensitive surfaces, resulting in less than optimal production levels.

As a second shortcoming, pollutant controlled systems that rely upon a downward, laminar flow have been found to be ineffective when the enclosure is opened (e.g. through a door or window) in order to access the pollutant controlled workspace. Most notably, opening the enclosure not only causes clean air to prematurely escape from the workspace but also contaminated air to enter into the workspace, thereby creating inefficiencies.

SUMMARY OF THE INVENTION

It is an object of the present invention to provide a new and improved system for maintaining a pollutant controlled workspace.

It is another object of the present invention to provide a system of the type as described above that is designed to effectively limit the number of particles present in the air within the pollutant controlled workspace.

It is yet another object of the present invention to provide a system of the type as described above that operates effectively even with horizontal elements located within the pollutant controlled workspace.

It is still another object of the present invention to provide a system of the type as described above that is limited in size, inexpensive to manufacture and cost effective to operate.

It is yet still another object of the present invention to provide a system of the type as described above that allows for access to the workspace without compromising the quality of air retained therein.

Accordingly, there is provided a system for maintaining a pollutant controlled workspace, the system comprising (a) an enclosure having a front, a back, a top, a bottom, and a pair of sides that together define a common interior cavity, wherein one of the front and the back of the enclosure comprises one or more air permeable interior panels and one or more air impermeable exterior panels that together define a narrow airflow channel therebetween, (b) an air circulation subsystem for delivering a flow of treated air into the narrow airflow channel, and (c) a control subsystem for regulating the flow of treated air delivered by the air circulation subsystem into the narrow airflow channel, (d) wherein the treated air passes through the one or more interior panels and travels through the interior cavity as a horizontal laminar flow.

Various other features and advantages will appear from the description to follow. In the description, reference is made to the accompanying drawings which form a part thereof, and in which is shown by way of illustration, various embodiments for practicing the invention. The embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings wherein like reference numerals represent like parts:

FIG. 7 is an enlarged, front perspective view of one of the movable exterior panels shown in FIG. 4;

FIG. 8 is an enlarged, front perspective view of one of the movable interior panels shown in FIG. 4;

DETAILED DESCRIPTION OF THE INVENTION

Figure 1:
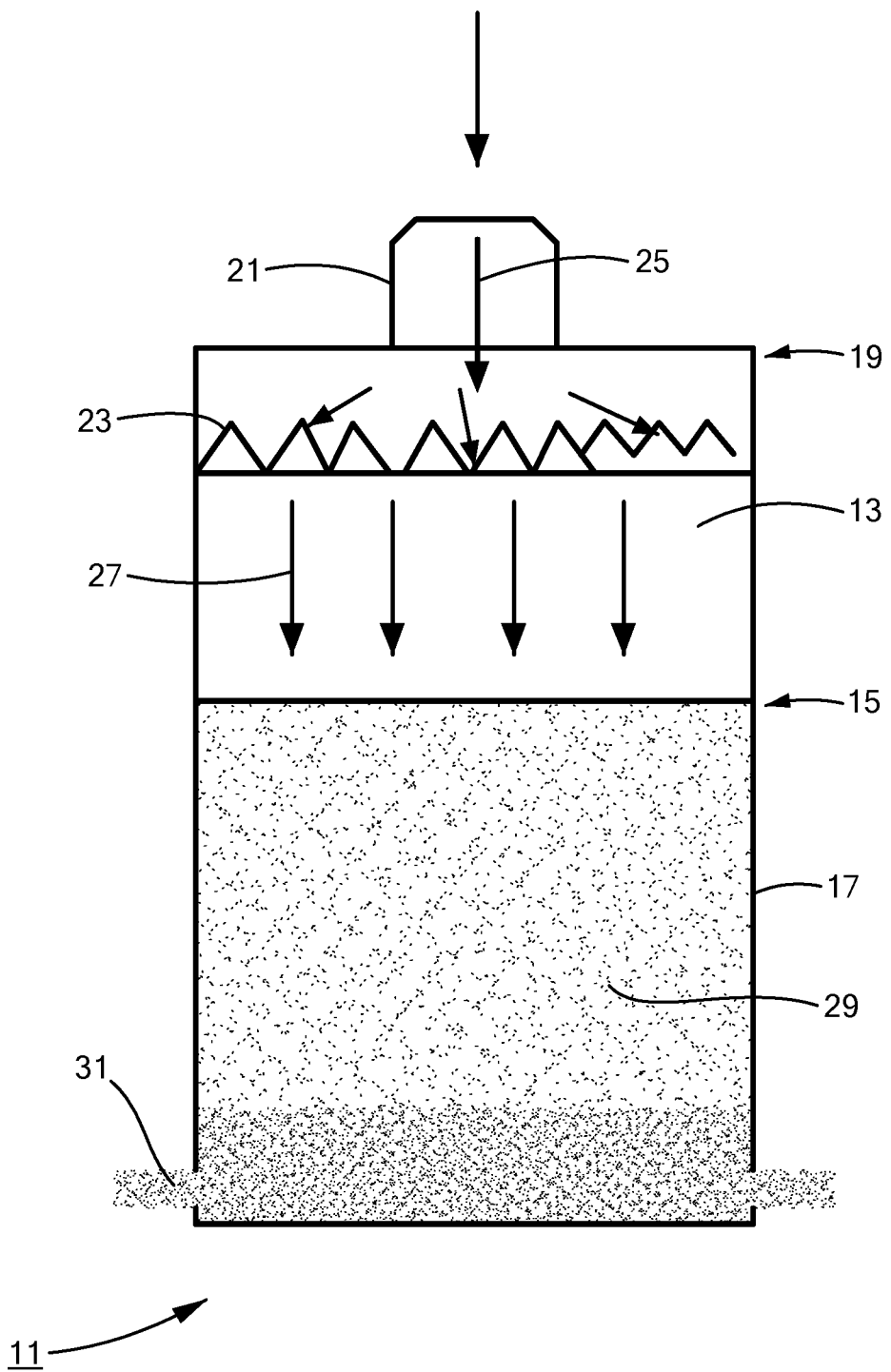
FIG. 1 is a simplified section view of a prior art system for maintaining a clean workspace.

Referring now to FIGS. 2(a), 2(b), 3(a) and 3(b), there is shown a system for maintaining a pollutant controlled, or clean, workspace, the system being constructed according to the teachings of the present invention and identified generally by reference numeral 11. As will be explained further in detail below, system 11 is specifically designed to minimize the presence of pollutants by generating a laminar flow of clean air that travels through the workspace along a generally horizontal path.

As defined herein, use of the term "pollutants" represents any contaminant that is typically removed, to the extent possible, from a cleanroom or other similar environment. Examples of pollutants include, inter alia, dust, airborne microbes, and chemical vapors.

In this capacity, it is to be understood that system 11 is particularly well suited for use in manufacturing or research applications that are highly sensitive to presence of environmental contaminants (e.g. semiconductor manufacturing and testing, pharmaceutical manufacturing, and biotechnology research). In particular, the utilization of a generally horizontal, laminar flow of air to maintain a clean workspace renders system 11 particularly useful in environments which include horizontally disposed items (e.g. a continuous web, shelving, or instruments) that would otherwise block and turbulently recirculate air directed vertically downward.

To illustrate the aforementioned design feature, system 11 is shown in selected figures as providing a clean environment for a manufacturing process 13 that includes certain horizontally disposed elements. Specifically, process 13 is represented herein as comprising a thin, continuous web 15 that is advanced between treatment stations by a plurality of rollers 17, continuous web 15 including several, elongated horizontal sections. It is to be understood that web 15 is utilized within process 13 as a substrate on which at least one layer is deposited, etched, embossed and/or printed. In this manner, process 13 can be used to produce a wide variety of different products, including microelectronic devices, optical devices, and pharmaceuticals.

Construction of System 11

As seen in FIGS. 2(a)-3(b), system 11 comprises an airtight, box-like enclosure 19 shaped to define an interior cavity, or chamber, 21, an air circulation subsystem 23 for producing a flow of clean air throughout enclosure 19, a control subsystem 25 for regulating the flow of clean air generated by air circulation subsystem 23, and a cabinet 27 for supporting enclosure 19 and housing selected components of control subsystem 25. As referenced briefly above and described in greater detail below, the particular construction of enclosure 19 enables clean air produced by subsystem 23 to travel through interior cavity 21 as a generally horizontal, laminar flow, which is a principal object of the present invention.

In the present embodiment, enclosure 19 is constructed as a plurality of individual modules 29-1 thru 29-4 that are arranged in a side-by-side relationship and that are secured together to form a unitary structure with common interior cavity 21. This modularity in design allows for the reconfiguration and scalability of enclosure 19 to suit the particular needs of its intended usage (i.e. depending upon the size of the clean workspace required). Additionally, this modularity in design provides considerable ease in the assembling and disassembling of enclosure 19 and thereby assists in its transport.

Together, modules 29 provide enclosure 19 with a generally box-shaped, or booth-like, construction that includes a common planar front 31-1, a common planar back 31-2, a common planar top 31-3, a common planar bottom 31-4, a common planar left side 31-5, and a common planar right side 31-6.

Figure 4:
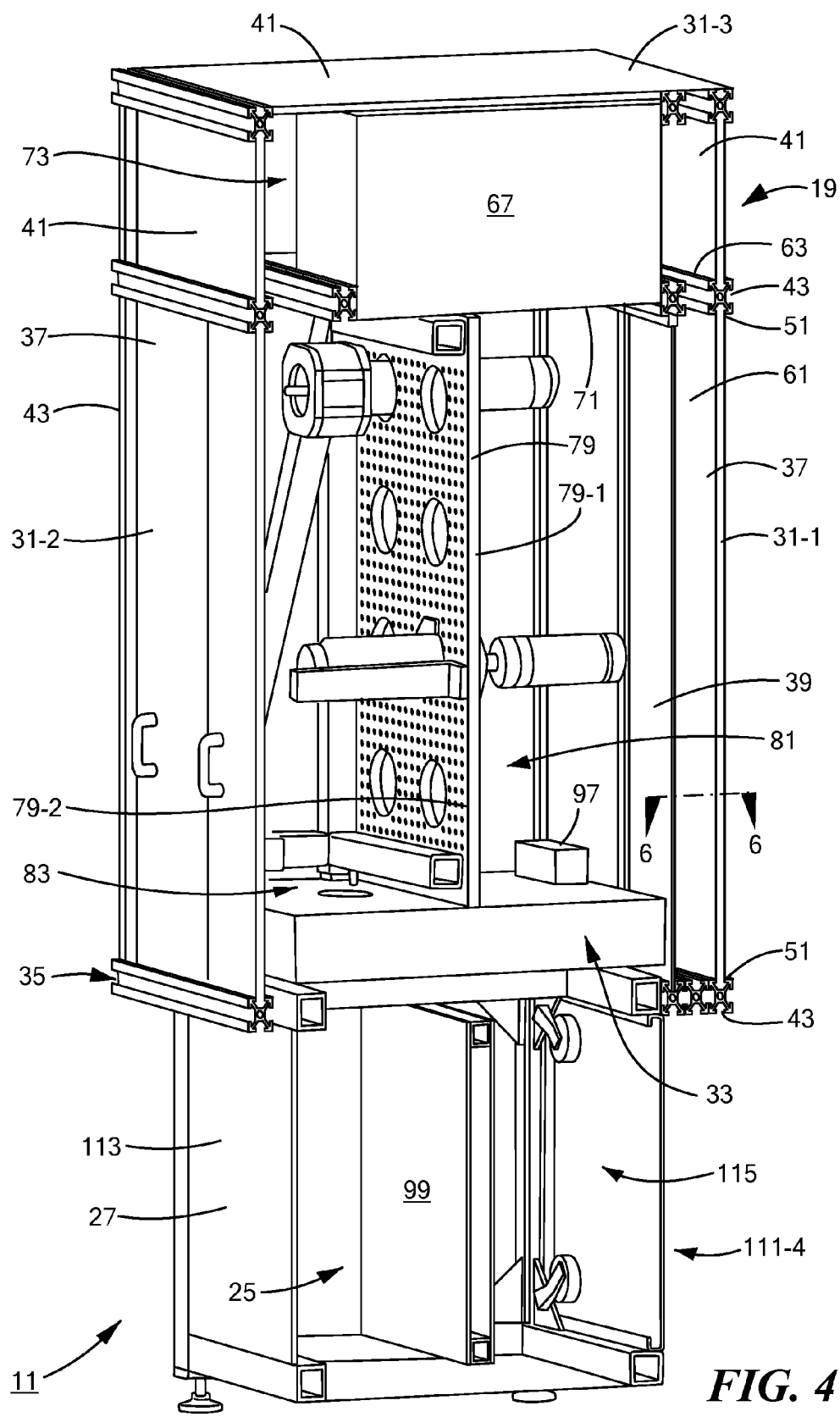
FIG. 4 is a rear, perspective, section view of the system shown in FIG. 2(b), taken along lines 4-4.
Figure 5:
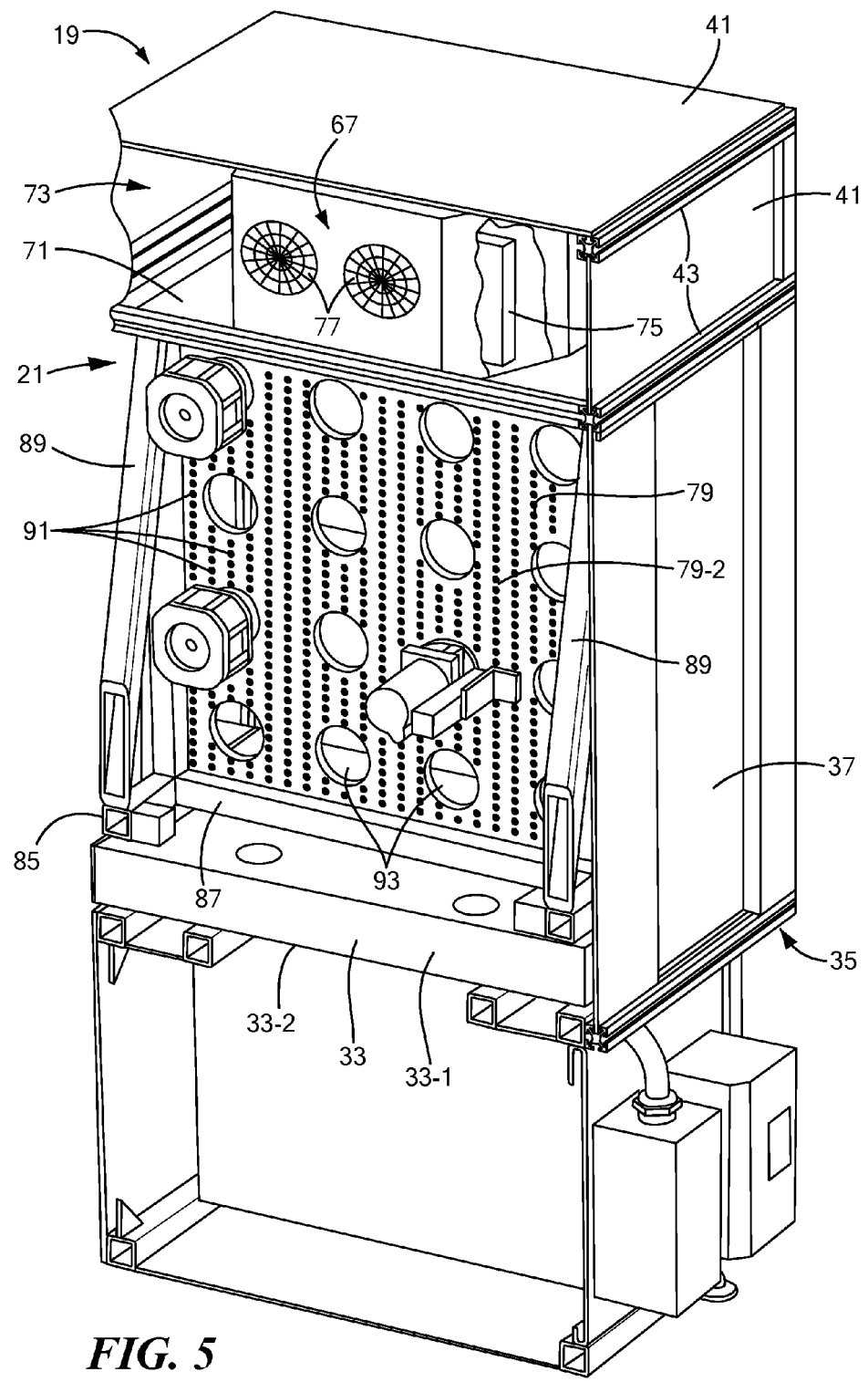
FIG. 5 is a fragmentary, rear, perspective section view, broken away in part, of the system shown in FIG. 3(a), taken along lines 5-5.

As seen most clearly in FIGS. 4 and 5, enclosure 19 comprises a base, 33, a generally open frame 35 that extends around base 33 and defines the basic configuration of enclosure 19, a plurality of movable exterior panels, or doors, 37 that are slidably coupled to and selectively enclose the lower portion of frame 35, a plurality of movable interior panels, or screens, 39 disposed directly inside of selected interior panels 37 in a spaced apart relationship relative thereto, and a plurality of fixed panels 41 that enclose the upper portion and top of frame 35.

Base 33 is preferably in the form of a generally solid support block having a flat top surface 33-1 and a flat bottom surface 33-2. As will be explained further below, top surface 33-1 serves as a support surface on which the various instruments to be utilized in the clean workspace can be mounted. Additionally, bottom surface 33-2 is designed to sit securely upon cabinet 27 (e.g. through one or more non-slip pedestals, or feet).

Frame 35 comprises a plurality of framing members 43 that are joined together to form the overall structure, or skeleton, of enclosure 19. Each framing member 43 is preferably constructed of a rigid and durable material that is designed to allow for its releasable connection with other framing members 43 in the desired configuration (e.g. using an 80/20® model T-slot aluminum building system of the type which is manufactured and sold by 80/20 Inc., of Columbia City, Ind.).

As referenced above, enclosure 19 is constructed as a plurality of individual modules 29-1 thru 29-4. Accordingly, it is to be understood that framing members 43 of adjoining modules 29 are preferably connected with appropriate fastening elements to render frame 35 a unitary structure.

Together, framing members 43 define a plurality of enlarged, open, access windows 47 along the bottom portion of enclosure 19, as shown in FIGS. 2(a)-3(b). Specifically, in the present embodiment, framing members 43 define a first set of four access widows 47-1 thru 47-4 along the front, bottom portion of enclosure 19, a second set of four access windows 47-5 thru 47-8 along the rear, bottom portion of enclosure 19, a single access window 47-9 in the left, bottom portion of enclosure 19, and a single access window 47-10 in the right, bottom portion of enclosure 19 (i.e. ten access windows 47 in total). As can be appreciated, windows 47 provide the user with access to interior cavity 21 and any components contained therein.

Additionally, framing members 43 define a plurality of upper openings 49 along the top portion of enclosure 19. Specifically, in the present embodiment, framing members 43 define a first set of four upper openings 49-1 thru 49-4 along the front, top portion of enclosure 19, a second set of four upper openings 49-5 thru 49-8 along the rear, top portion of enclosure 19, a single upper opening 49-9 in the left, upper portion of enclosure 19, a single upper opening 49-10 in the right, upper portion of enclosure 19, and a third set of four upper openings 49-11 thru 49-14 along the top, or ceiling, of enclosure 19 (i.e. fourteen openings 49 in total).

It should be noted that enclosure 19 is not limited to either (i) a particular number and/or arrangement of modules 29 or (ii) to a particular number and/or arrangement of access windows 47 and upper openings 49 in frame 35. Rather, it is to be understood that the particular configuration of frame 35 as well as the particular number and dimension of access windows 47 and openings 49 formed therein could be modified to suit the needs of the intended application without departing from the spirit of the present invention.

As seen most clearly in FIG. 4, slider tracks 51 are preferably coupled to frame 35 along the top and bottom edges of each access window 47. The particular number of slider tracks 51 coupled to frame 35 within each window 47 is dependent upon the particular number of exterior panels 37 and interior panels 39 located therein.

In the present embodiment, first and second pairs of slider tracks 51 are coupled to frame 35 along the top and bottom edges of each of side access windows 47-9 and 47-10, the first and second pairs of slider tracks 51 being arranged front-to-back, in parallel, in a tightly nested relationship. In this manner, one pair of exterior doors 47 can be slidably mounted within each of side access windows 47-9 and 47-10 and thereby provides selective enclosure.

Figure 6:
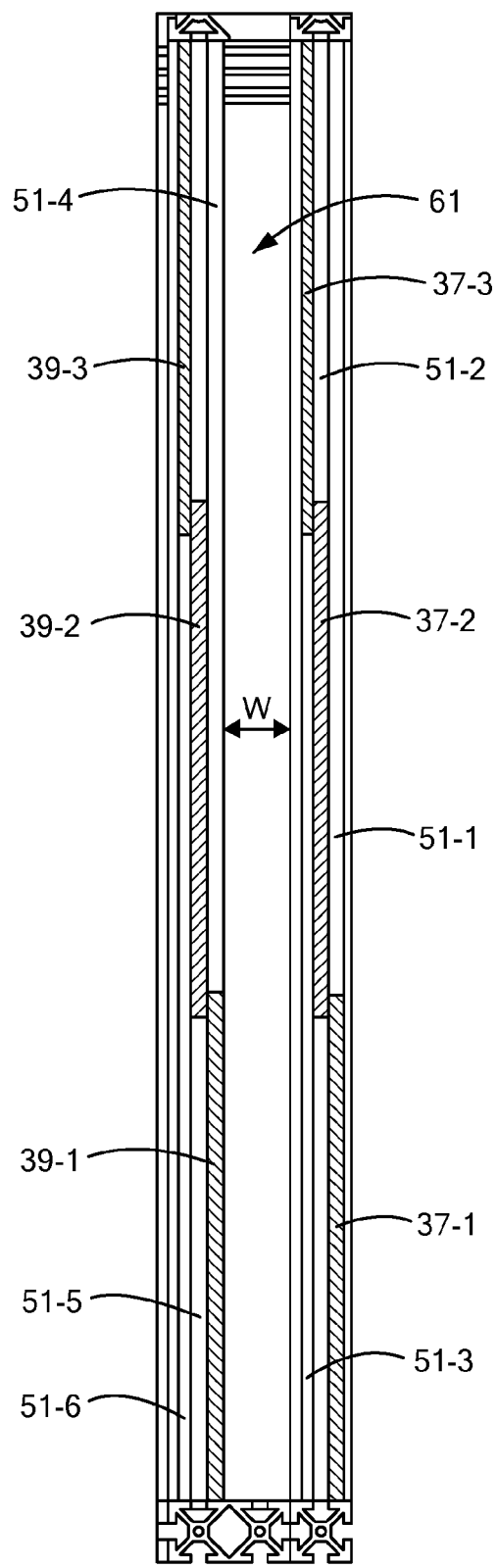
FIG. 6 is a top section view of the system shown in FIG. 4, taken along lines 6-6.

Similarly, as seen most clearly in FIG. 6, a first set of three pairs of slider tracks 51-1 thru 51-3 is coupled to frame 35 along the top and bottom edges of each of front and rear access windows 47-1 thru 47-8, slider tracks 51-1 thru 51-3 being arranged front-to-back, in parallel, in a tightly nested relationship. In this manner, three exterior panels 37-1 thru 37-3 can be slidably mounted within slider tracks 51-1 thru 51-3, respectively, and thereby provide selective enclosure of each of front and rear access windows 47-1 thru 47-8.

A second set of three pairs of slider tracks 51-4 thru 51-6 is coupled to frame 35 along the top and bottom edge of each of front access windows 47-1 and 47-2 (i.e. in the front of modules 29-1 and 29-2), slider tracks 51-4 thru 51-6 being arranged front-to-back, in parallel, in a tightly nested relationship. It should be noted that slider tracks 51-4 thru 5-16 are spaced slightly in from slider tracks 51-1 thru 51-3 in a generally parallel relationship. As will be explained further below, three interior panels 39-1 thru 39-3 can be slidably mounted within slider tracks 51-4 thru 51-6, respectively, and thereby create an interior, vertical baffle within the front of modules 29-1 and 29-2.

Accordingly, altogether enclosure 19 is constructed with twenty-eight exterior panels 37 and six interior panels 39 that selectively enclose interior cavity 21. However, it should be noted that enclosure 19 is not limited to a particular number of arrangement of panels 37 and 39. Rather, it is to be understood that the number and arrangement of panels could be modified to suit the needs of the intended application without departing from the spirit of the present invention. For example, interior panels 39 could be mounted within front access windows 47 of all four modules 29-1 thru 29-4, rather than in just modules 29-1 and 29-2, to help create uniform, horizontally-directed, laminar air flow throughout the entire interior cavity 21.

Additionally, it should be noted that interior and exterior panels 37 and 39 could be temporarily or permanently removed from frame 35 by simply lifting each panel vertically upward and, in turn, pivoting its bottom edge out from its associated track 51. Likewise, each of interior and exterior panels 37 and 39 could be installed back into frame 35 by first angling the panel such that its top edge aligns within a corresponding upper track 51 and then, while maintaining an upward application of force on the panel, angling its bottom edge into alignment within a corresponding lower track 51.

Referring now to FIG. 7, each exterior panel 37 is preferably constructed as a slidable door that includes a generally rectangular, planar, transparent glass pane 53 onto which a U-shaped handle 55 is affixed to its exterior surface. Preferably, exterior panels 37 located in the front of enclosure 19 are treated with an ultraviolet (UV) protective coating to protect any light-sensitive items located within the front region of interior cavity 21.

As seen in FIG. 8, each interior panel 39 is preferably constructed as a slidable screen that includes a generally rectangular, planar mesh sheet 57 that is covered about its periphery by a rigid frame, or border, 59. Preferably, mesh sheet 57 has a mesh count and thread diameter that results in a relatively large number of fine mesh openings. Due to large number of relatively small openings formed in mesh sheet 57, each interior panel 39 functions as a baffle that restricts air from passing therethrough until a suitable buildup of air pressure is received, which is beneficial for reasons to be explained further below.

Referring back to FIG. 6, each exterior panel 37 is slightly larger in width than one-third of the overall width of each access window 47 located in the front and rear of enclosure 19. Accordingly, by arranging, or fanning, exterior panels 37 front-to-back in a slightly overlapping fashion, each access window 47 can be suitably enclosed. In order to gain access to interior cavity 21, one or more of exterior panels 37 can then be slidably displaced within tracks 51 in either direction to the extent required.

Similarly, each interior panel 39 is slightly larger in width than one-third of the overall width of each access window 47 located in the front of modules 29-1 and 29-2. Accordingly, by arranging, or fanning, interior panels 39 front-to-back in a slightly overlapping fashion, the aforementioned access windows 47 can be suitably enclosed. In order to gain access to interior cavity 21, one or more of interior panels 39 can then be slidably displaced within tracks 51 in either direction to the extent required.

As seen most clearly in FIGS. 4 and 6, interior movable panels 39 are spaced slightly in from exterior movable panels 37 so as to define a narrow, vertically disposed, air passageway, or airflow channel, 61 therebetween. Preferably, the width W of passageway 61 is approximately 1.5 inches. With enclosure 19 constructed as such, interior panels 39 not only limit the number of pollutants that can enter into interior cavity 21 with exterior panels 37 positioned open, but also function together as a baffle that prevents clean air from entering the workspace until a suitable, uniform supply of air pressure is built up within airflow channel 61. Once the requisite pressure is built within channel 61, the clean air ultimately flows evenly through the large quantity of openings in interior panels 39 and travels rearward through the clean workspace as a horizontal laminar flow, which is a principal object of the present invention.

Referring back to FIGS. 4 and 5, fixed panels 41 are secured to frame 35 to enclose each opening 49. Each fixed panel 41 is preferably constructed of a rigid, durable, transparent and non-permeable material, such as a Plexiglass® acrylic sheet. Preferably, a rubber gasket 63 is disposed between each fixed panel 41 and frame 35 to create an airtight seal that prohibits any environmental pollutants from entering into interior cavity 21 through the upper portion of enclosure 19.

It should be noted that airtight construction of enclosure 19 provides two notable advantages. As a first advantage, the airtight construction of enclosure 19 enables a defined supply air to continuously re-circulate therethrough, thereby creating a closed system with air that is repeatedly filtered for particulates. As a second advantage, the airtight construction of enclosure 19 enables the air pressure within the clean workspace to be increased to a level that effectively creates a barrier through which particles are unable to traverse, as will be explained further below.

As referenced briefly above, system 11 is provided with an air circulation subsystem 23 for generating a modifiable flow of air through interior cavity 21 in order to create a pollutant-controlled, or clean, workspace. As will be explained further in detail below, air circulation subsystem 23 includes (i) at least one internally-filtered intake fan, or blower, 65 for drawing source air into enclosure 19, (ii) at least one High-Efficiency Particulate Arrestance (HEPA) fan filter unit 67 designed to remove pollutants from the source air to yield a supply of treated, or clean, air and, in turn, circulate the treated air through enclosure 19 as a horizontal, laminar flow, and (iii) at least one exhaust fan 69 for locally extracting any emissions produced by the fabrication process running within enclosure 19.

Figure 3A:
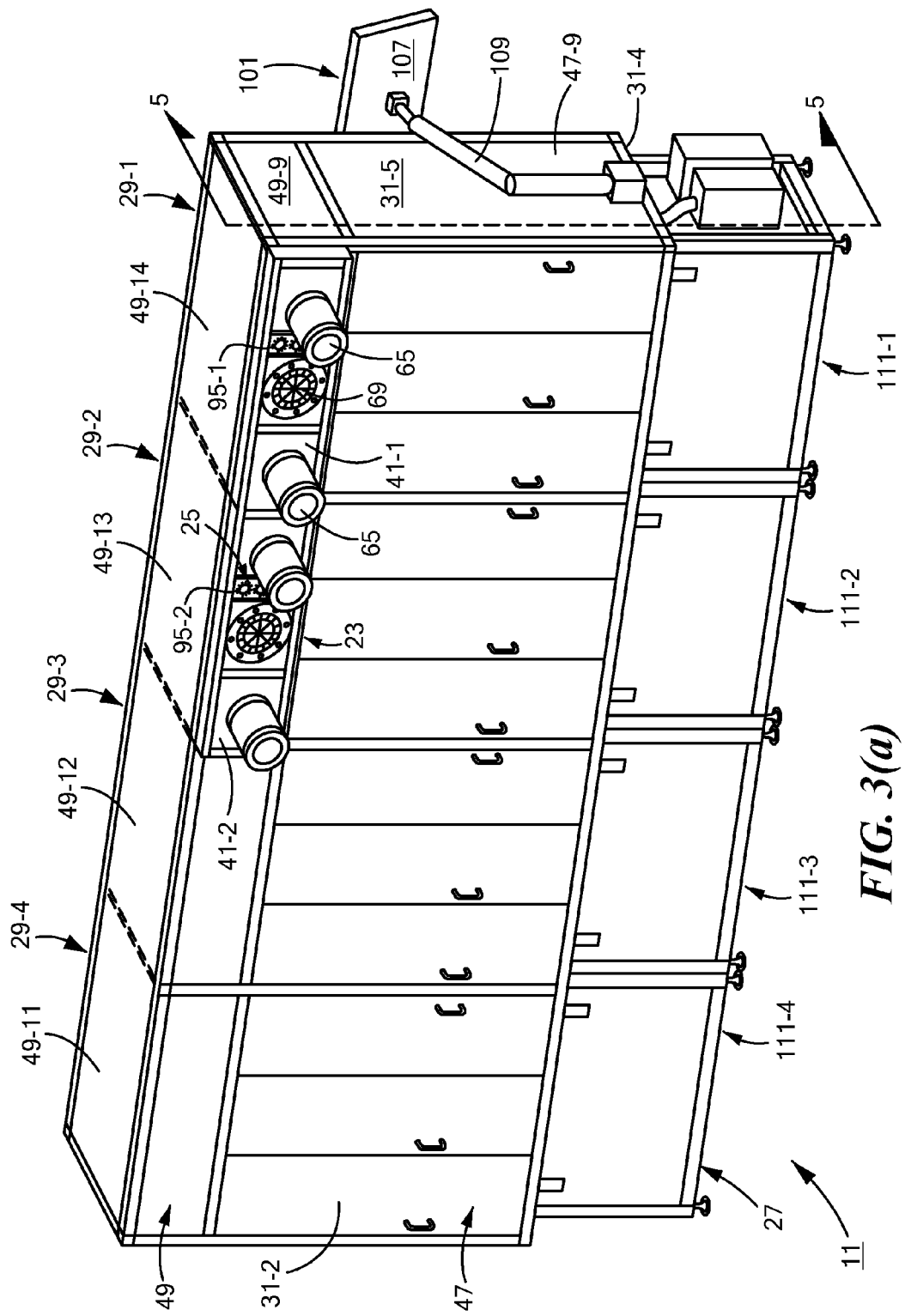
FIGS. 3(a) and 3(b) are rear perspective and rear plan views, respectively, of the system shown in FIG. 2(a), the system being shown without any components inside the enclosure for ease of illustration.
Figure 3B:
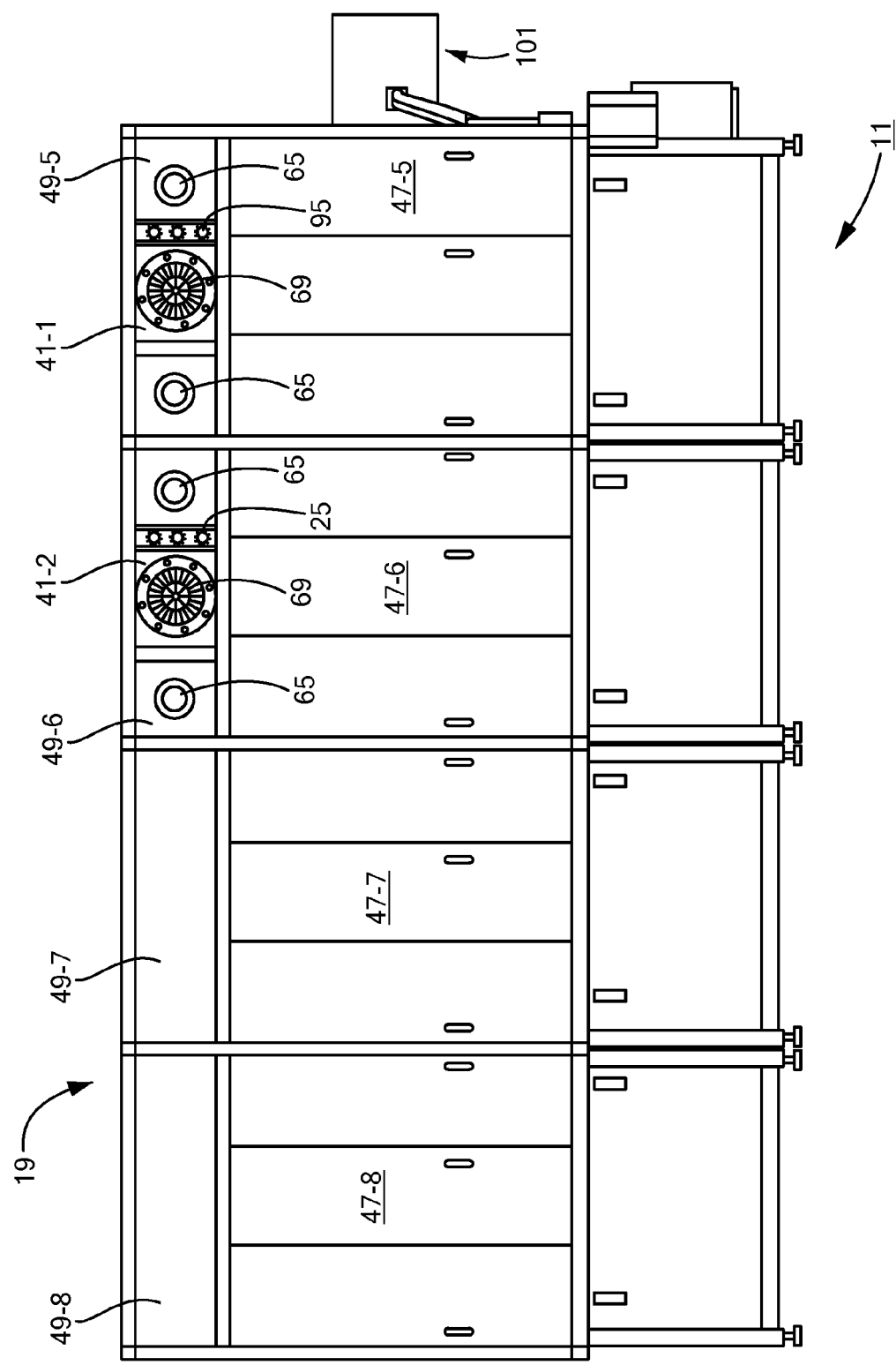

As seen most clearly in FIGS. 3(a) and 3(b), a pair of modified panels 41-1 and 41-2 is coupled to frame 35 in the upper-rear portion of modules 29-1 and 29-2, respectively, to allow for the selective passage of air therethrough. Specifically, each of modified panels 41-1 and 41-2 is provided with one centrally-located exhaust fan 69 and two separate intake fans 65 disposed on opposite sides of exhaust fan 69.

As seen most clearly in FIGS. 4 and 5, a solid horizontal shelf 71, preferably constructed of as rigid and durable panel, is located within the upper portion of interior cavity 21 inside each module 29. Together, shelves 71 and fixed panels 41 form a partially enclosed plenum 73 that extends horizontally within the upper region of interior cavity 21. As will be explained in detail below, plenum 73 is a designated space located between the clean workspace and enclosure top 31-3 that serves as a conduit for delivering clean air towards the front of enclosure 19. Thereafter, the clean air is circulated rearward as a generally horizontal, laminar flow through the lower region of interior cavity 21.

Four separate HEPA fan filter units, or FFU, 67 are mounted on corresponding shelves 63 within modules 29-1 thru 29-4. As such, the four separate HEPA fan filter units 67 are arranged within enclosure 19 in a side-by-side spaced apart relationship.

As seen most clearly in FIG. 5, each HEPA fan filter unit 67 is constructed as a unitary device that includes a HEPA filter 75 and a pair of HEPA fans 77. Preferably, HEPA filter 75 represents any fibrous filtration sheet that is capable of removing nearly all (approximately 99.97%) airborne particles with a size of at least 0.3 μm from a supply of air. HEPA fans 77 are located behind HEPA filter 75 and draw into fan filter unit 67 both (i) air that has previously cycled through the workspace and (ii) source air introduced into enclosure 19 by intake fan 65 to yield a supply of treated air.

Additionally, HEPA fans 77 are responsible for circulating the treated air through enclosure 19 as a horizontal, laminar flow, as will be explained further below.

Figure 2A:
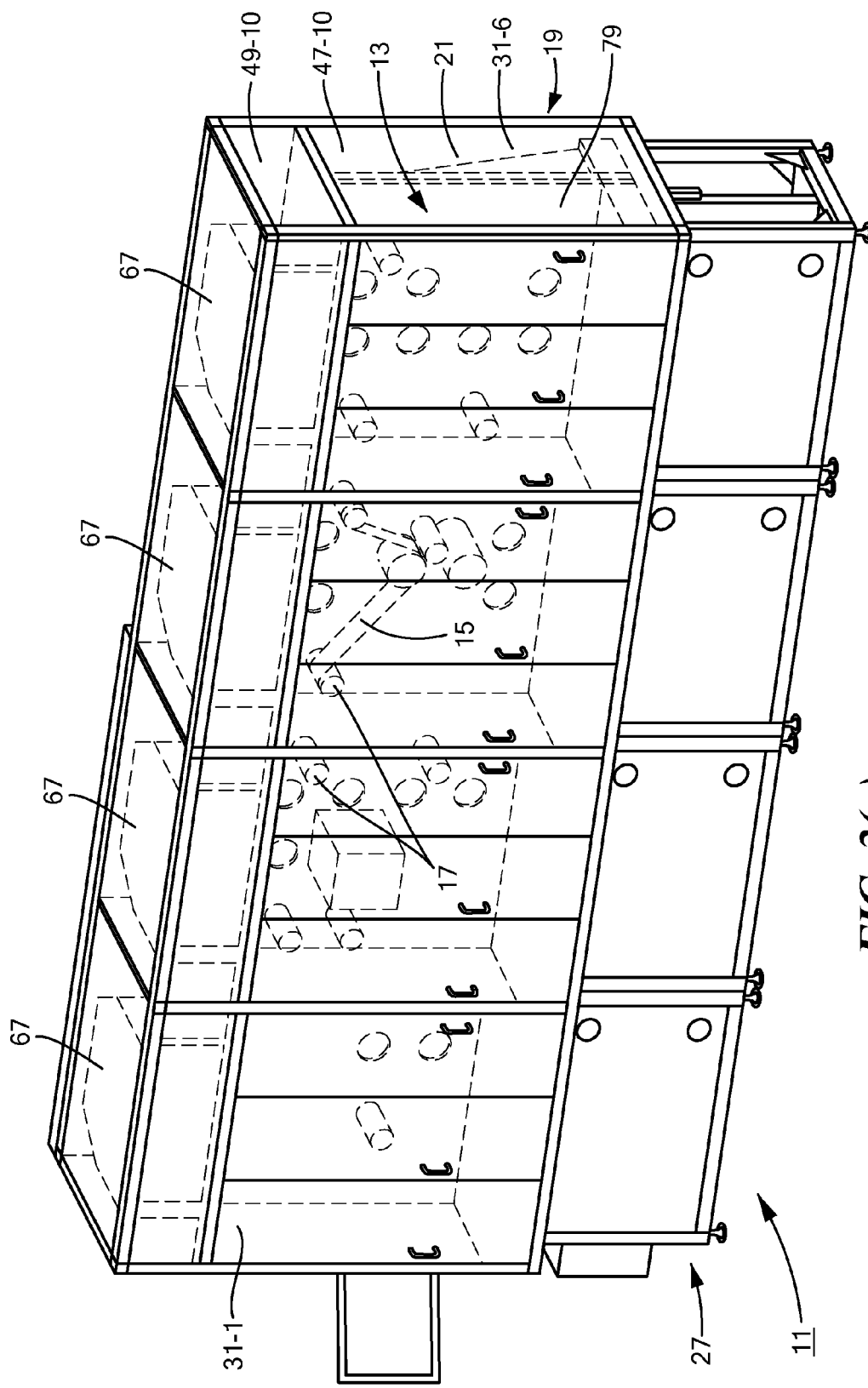
FIG. 2(a) is a front perspective view of a system for maintaining a clean workspace, the system being constructed according to the teachings of the present invention.

In the present embodiment, a unitary back board 79 is coupled to top surface 33-1 of base 33 and extends vertically upward in a generally orthogonal relationship relative thereto, as shown in FIGS. 2(a), 4 and 5. As can be appreciated, back board 79 serves to partition the lower region of interior cavity 21 into (i) a clean, pollutant-controlled workspace 81 between back board 79 and front 31-1 of enclosure 19 and (ii) a return channel, or return, 83 between back board 79 and rear 31-2 of enclosure 19. During operation of system 11, back board 79 functions not only as a mounting surface on which the particular components to be utilized within the clean workspace can be secured but also as an airflow restrictor that ensures that air flows uniformly between workspace 81 and return 83.

Back board, or board 79 is preferably constructed as a thin, rectangular, planar member that includes a generally flat front surface 79-1 and a generally flat rear surface 79-2. In order to provide the requisite structural support for any components mounted thereon, board 79 is preferably constructed of a relatively rigid and durable material, such as aluminum.

As seen most clearly in FIG. 5, board 79 is retained in its vertical orientation by an easel-type, bracket assembly, or stand, 85 that is secured to base 33. In the present embodiment, stand 85 includes one or more framing-type brackets 87 that are mounted directly onto rear surface 79-2 of board 79 along its periphery with appropriate fastening elements. Additionally, stand 85 includes a plurality of bracing, or truss-type, brackets 89 that connect to framing-type brackets 87 at either an acute or right angle. With stand 85 configured as such, selected brackets 87 and 89 are then directly affixed to top surface 33-1 of base 33 with appropriate fastening elements to fixedly secure board 79 in its desired position.

A set of limited diameter thru holes 91 is formed into board 79 to enable air to flow between workspace 81 and return 83. Preferably, a large quantity of thru-holes 91 is formed into board 79 as an equidistantly-spaced arrangement, or grid. In this manner, air is able to flow through holes 91 in board 79 as a uniform, disperse, laminar flow that experiences a minimal amount of turbulence (i.e. swirling).

Additionally, a plurality of enlarged mounting holes 93 is formed in board 79 at select locations. Mounting holes 93 enable instruments to be used in the intended low pollutant workspace 81 to be easily secured to board 79. For instance, a series of rollers and web treatment devices may be secured to board 79 to transport and treat a thin continuous web through various stations of a microelectronics fabrication process.

As referenced briefly above, system 11 is equipped with exhaust fans 69 to locally extract any potentially harmful emissions (e.g. chemical vapors) produced by the fabrication process running within enclosure 19. Accordingly, when needed, a limited diameter exhaust tube (not shown) is mounted to board 79 so as to penetrate, at least partially, through a mounting hole 93 in board 79. Preferably, the particular mounting hole 93 utilized is in close proximity to the source of such emissions. The exhaust tube extends through return 83 and its other end is coupled to exhaust fan 69. Although not shown in the present invention, an exhaust hose or other similar ductwork may be externally coupled to each exhaust fan 69 to draw potentially contaminant air suitably away from enclosure 13.

Referring now to FIGS. 3(a), 3(b), 4 and 9, control subsystem 25 is responsible for manually and/or automatically regulating the flow of air that is generated by air circulation subsystem 23. As can be seen, control subsystem 25 comprises at least one control panel 95 for manually regulating the various fans of air circulation subsystem 23, at least one particle counter 97 disposed within clean workspace 81 for measuring the number of airborne contaminants within clean workspace 81, a controller 99 for automatically regulating the various fans of air circulation subsystem 23 based on readings collected by particle counter 97 and other relevant system sensors, and an interactive display 101 for setting the basic parameters for controller 99 and providing operational information to the user.

In the present embodiment, a pair of separate control panels 95-1 and 95-2 is provided to regulate operation of the various fans within each of individual modules 29-1 and 29-2, respectively. However, it is to be understood that a single control panel 95 could be provided to regulate operation of all the various fans within entire system 11 without departing from the spirit of the present invention.

Figure 9:
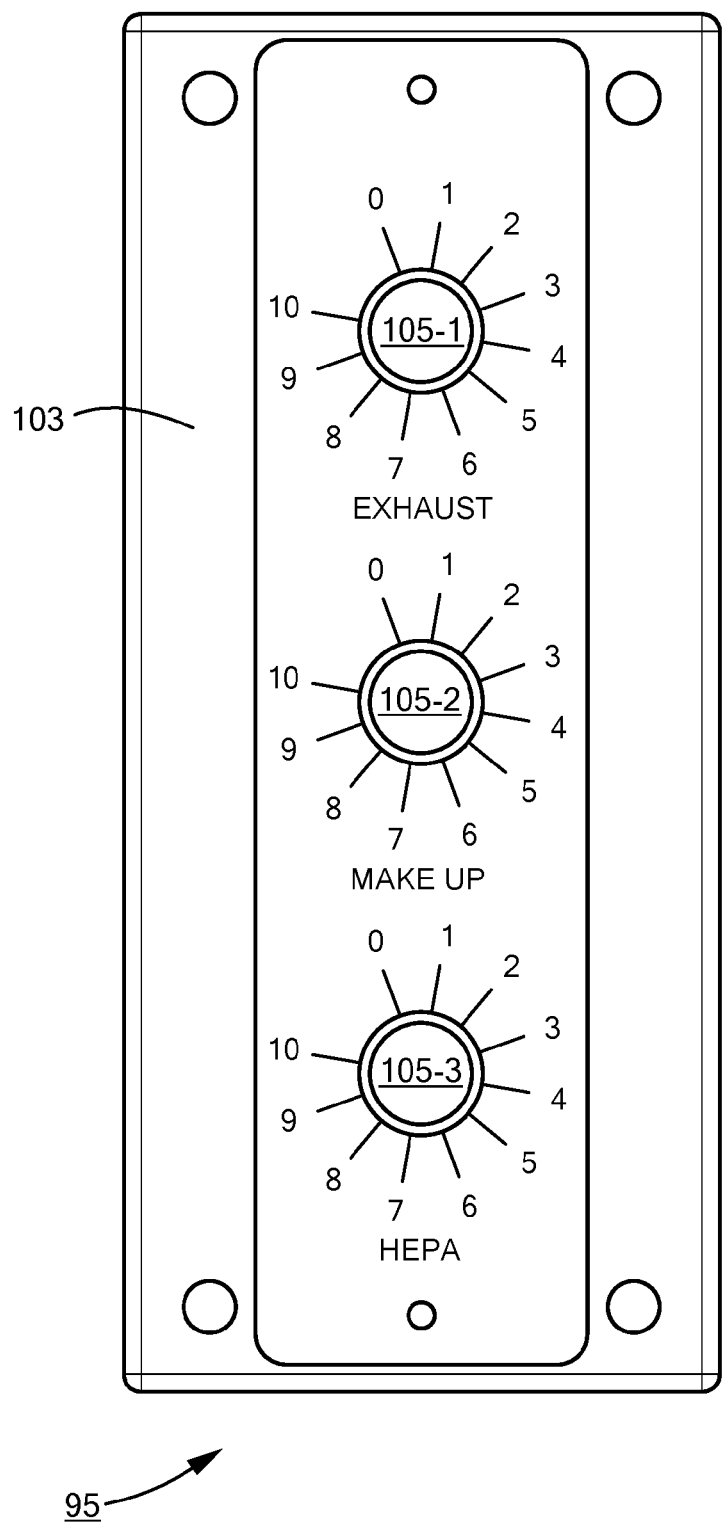
FIG. 9 is an enlarged, rear plan view of one of the control panels shown in FIG. 3(a)

As seen most clearly in FIG. 9, each control panel 95 includes a base plate 103 that is fixedly secured onto the rear of enclosure 19 and a plurality of manual control knobs 105-1 thru 105-3 in electrical connection with the fans of air circulation subsystem 23. Specifically, each control panel 95 includes an exhaust control knob 105-1 in electrical connection the exhaust fan 69 for its corresponding module 29, a make-up control knob 105-2 in electrical connection with the pair of intake fan 65 for its corresponding module 29, and a HEPA control knob 105-3 in electrical connection with the fan filter unit 67 for its corresponding module 29. By adjusting each of control knobs 105, the user can regulate, inter alia, the pressure and velocity of clean air delivered through workspace 81 as a laminar flow.

In the present embodiment, plate 95 is marked with eleven incremental settings about each control knob 105 to assist in metering the speed of its corresponding fans, the zero setting indicating that the fans connected thereto receive no power and the ten, or maximum, setting indicating that the fans connected thereto operate at full speed. To prevent fan motor failure, it is recommended that each of fans 65, 69 and 77 operates primarily at no greater than 50% of its maximum fan speed.

As seen most clearly in FIG. 4, at least one particle counter 97 is disposed in an unobtrusive location within clean workspace 81 (e.g. in a corner of enclosure 19) in order to measure the cleanliness of air present therein. Preferably, each particle counter 97 represents any handheld air particle detector that is commonly used to monitor and test cleanrooms, such as a MET ONE 227 model particle detector of the type manufactured by Hach Ultra Analytics, Inc.

It should be noted that the particular number and location of particle counters 97 can be useful in maximizing the cleanliness of workspace 81. For instance, if a notably high particle count is routinely detected in a particular module 29 of enclosure 19, an increased amount of air flow can be circulated within the module 29 to minimize the presence of pollutants.

A programmable compute device, or controller, 99 is electrically connected to all particle counters 97 (or other similar sensors) located within enclosure 19 as well as air circulation subsystem 25. In this manner, a closed loop system can be achieved in which basic particle count parameters are programmed into controller 99 and, in turn, are monitored within enclosure 19 using counters 97. Accordingly, the speed of fans 65, 69 and 77 can be automatically and instantaneously adjusted to compensate for fluctuations in measured particle counts and thereby ensure an optimally clean workspace 81, which is highly desirable.

For instance, a sudden substantial increase in detected particle counts within a particular module 29 may be indicative of an open exterior panel 37. Consequently, door sensors may be provided in frame 35 in electrical communication with controller 99 to confirm an open access panel 37. In response to determining an open condition for one or more panels 37, controller 99 may (i) initiate an alarm and/or (ii) temporarily adjust the speed of selected fans in order to maintain the pressure of air within workspace 81 above atmospheric pressure and thereby prevent outside contaminant air from entering enclosure 19, as will be explained further in detail below.

Figure 2B:
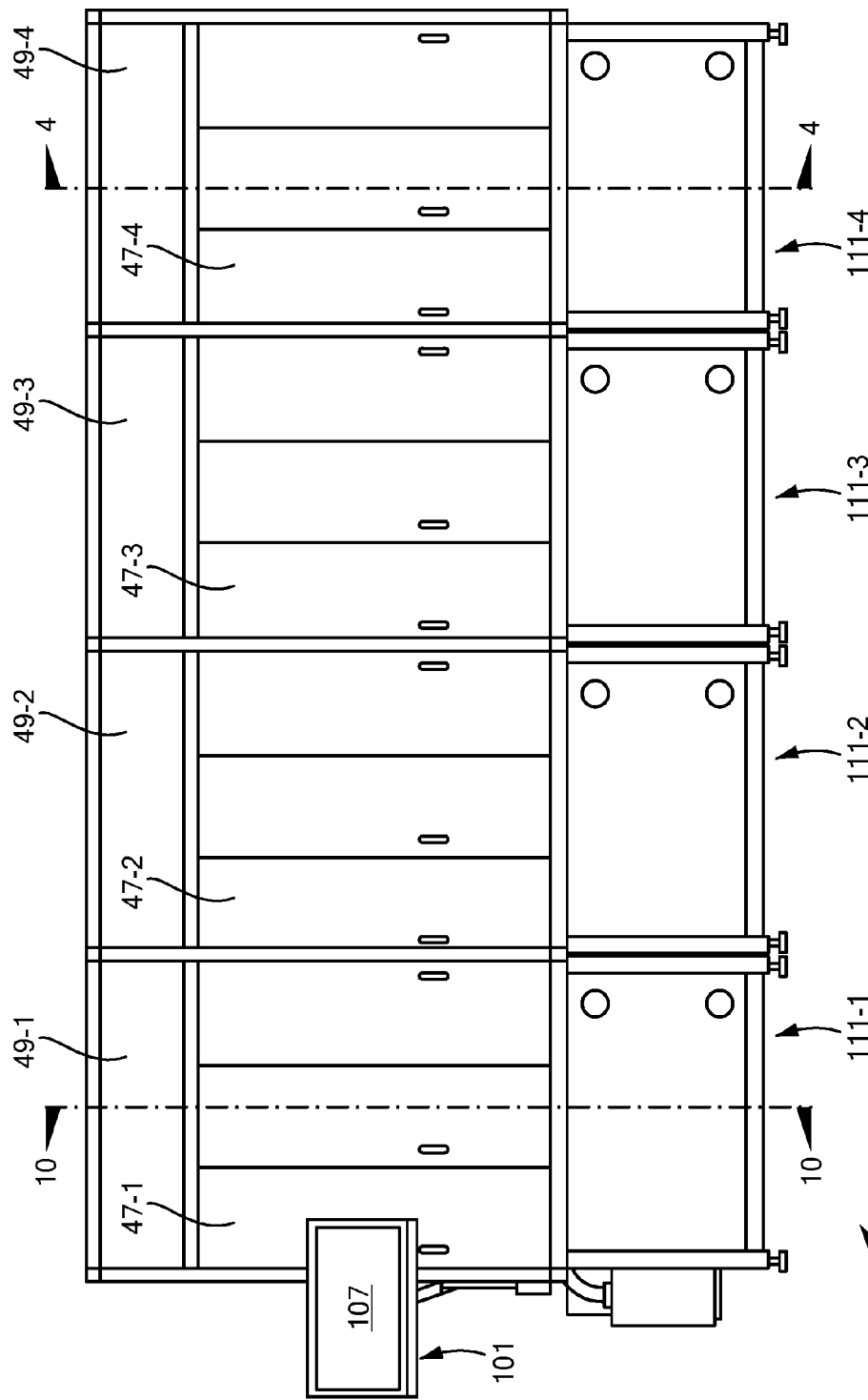
FIG. 2(b) is a front plan view of the system shown in FIG. 2(a), the system being shown without any components inside the enclosure for ease of illustration.

As seen most clearly in FIGS. 2(b), 3(a) and 3(b), interactive display 101 preferably includes a touchscreen monitor 107 that is pivotally coupled to enclosure 19 through one or more movable support arms 109. As can be appreciated, monitor 107 is preferably in electrical communication with controller 99. In this respect, display 101 can be utilized by the user to monitor information relating to the operation of system 11 and, in turn, provide means for establishing and modifying certain air flow protocols.

Referring now to FIGS. 2(b), 3(a), 3(b) and 4, cabinet 27 is an enlarged unitary structure that supports enclosure 19 at an appropriate height and that houses selected components of system 11. Preferably, cabinet 27 is constructed of any rigid and durable material, such as metal, and has the same rough footprint as enclosure 19.

Cabinet 27 is represented herein as a plurality of individual modules 111-1 thru 111-4, with each cabinet module 111 designed to support a corresponding enclosure module 29. As referenced previously, the modularity in the design of enclosure 19 as well as cabinets 27 enables system 11 to be custom designed to suit the needs of the intended application.

As seen most clearly in FIG. 4, each module 111 is constructed as a rigid box-shaped housing comprising a plurality of panels 113 that together define an interior cavity 115. Preferably, selected components of system 11, such as controller 99, are disposed within interior cavity 115 for protective purposes.

Operation of System 11

As referenced above, system 11 is designed to maintain a pollutant-controlled, or clean, workspace 81. As a principal feature of the present invention, system 11 maintains clean workspace 81 by, among other things, circulating a repeatedly filtered, generally closed, supply of air through workspace 81 as a horizontal laminar flow. As can be appreciated, the utilization of a generally horizontal flow of clean air through enclosure 19 ensures that adequate air circulation is maintained within workspace 81, even in the presence of horizontally disposed components (e.g. tables, shelves and web-type surfaces to be treated), which is a principal object of the present invention.

Figure 10:
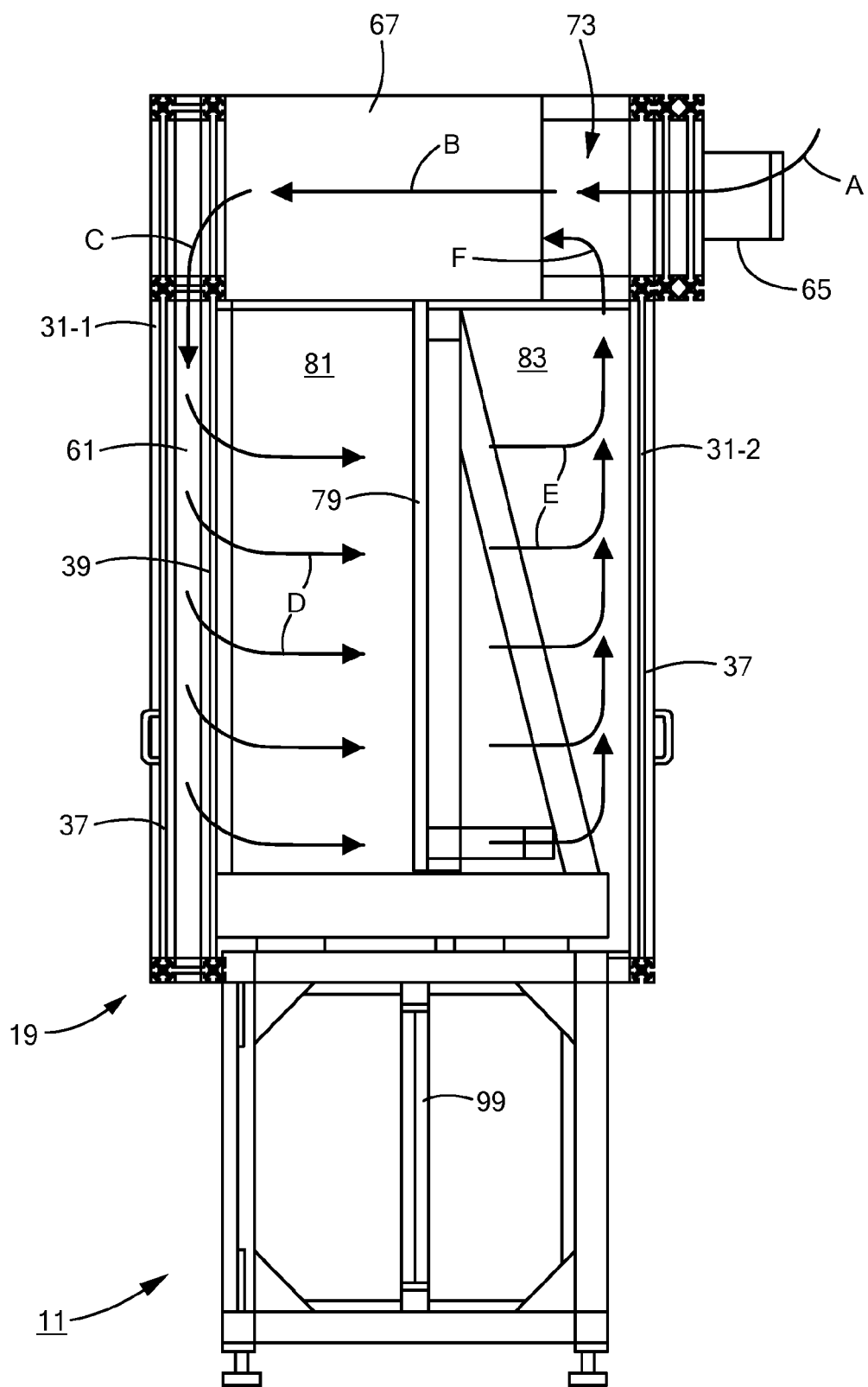
FIG. 10 is right side, section view of the system shown in FIG. 2(b), taken along lines 10-10, the system being shown with a sequence of arrows that indicate the principal flow of air within the enclosure during normal operation.

Referring now to FIG. 10, system 11 is designed to operate in the following manner to create clean workspace 81. Specifically, exterior and interior panels 37 and 39 are initially closed to create a closed environment within enclosure 19. Due to its airtight construction, enclosure 19 operates with minimum interference from outside contamination.

Either through the use of manual control panels 95 or programmable controller 99, each of fans 65, 69, and 77 is activated, as needed, to create the required air circulation through enclosure 19 to maintain clean workspace 81. As noted previously, the speed of each fan 65, 69, and 77 can be independently adjusted to achieve a particular result.

Activation of intake fan 65 draws a supply of untreated source air from outside enclosure 19 into the section of plenum 73 immediately behind fan filter unit 67, the drawing of source into plenum 73 being represented by arrow A in FIG. 10. The source air is then drawn into fan filter unit 67 through activation of HEPA fans 77, as represented by arrow B. As a result, the source air delivered into fan filter unit 67 is passed through HEPA filter 79 to yield a supply of treated, or clean, air that exits from the front of fan filter unit 67.

As can be seen, the region of plenum 73 immediately in front of fan filter unit 67 is in fluid communication with the airflow channel 61 defined between front exterior panels 37 and interior panels 39. As a result, the supply of clean air is blown by HEPA fans 77 vertically downward into channel 61, as represented by arrow C.

Due its construction with a large quantity of relatively small openings, interior panel 39 functions as a baffle that initially prevents the passage of clean air therethrough. Only until a relatively substantial and uniform amount of pressure is collected throughout channel 61 is air able to pass through interior panel 39, as represented by arrows D. As a result, the clean air that penetrates through interior panel 39 ultimately travels through clean workspace 81 as a horizontal laminar flow, which is a principal feature of the present invention.

As previously noted, the horizontal laminar flow of clean air prevents swirling of contaminants within workspace 81. By contrast, conventional cleanrooms that rely upon a downward vertical flow of clean air often produce turbulence due to the presence of horizontally disposed elements (e.g. tables, shelves, instruments and treated surfaces) within the air flow path. This turbulent flow of air can cause particulates to be recirculated or trapped within the workspace and, therefore, can compromise the cleanliness of the room.

Any contaminants present within workspace 81 are preferably driven rearward by the laminar flow of clean air. As a feature of the invention, vertical back board 79 provides a level of airflow resistance that causes air entering workspace 81 from channel 61 to ultimately pass through openings 91 in back board as a uniform flow, as represented by arrows E. In this manner, any particulates present within workspace 81 are carried by the clean air flow into return 83, thereby enabling any processes operating within workspace 81 to be subjected to the cleanest air levels possible.

Preferably, the air pressure within workspace 81 is maintained suitably higher than the air pressure within return 83 (e.g. through the precise control of fans 65, 69 and 77). As a result of this air pressure differential, particles are effectively blocked from traveling forward from return 83 into clean workspace 81.

The air within return 83, which may include particulates, is drawn upward by HEPA fans 77 into the region of plenum 73 immediately behind fan filter unit 67, as represented by arrow F. The air is then passed, once again, through HEPA filter 79. The aforementioned airflow cycle repeats within closed system 11 in order to achieve the desired cleanroom standard.

With exterior and interior panels 37 and 39 retained closed for a suitable time period, the number of particulates present within workspace 81 can be significantly reduced. Particle readings within workspace 81 can be monitored in real time by particle counters 97 and, in turn, analyzed by the user via display 101.

To access elements within enclosure 19, panels 37 and 39 can be slid open. It is important to note that, with front exterior and interior panels 37 and 39 open, pressure within workspace 81 is preferably maintained suitably above atmospheric pressure to effectively block outside contaminant air from entering enclosure 19. The aforementioned differential in air pressure is preferably maintained through the precise control of fans 65, 69 and 77, as will be explained further in detail below.

Although not represented in the airflow cycle shown in FIG. 10, it is to be understood that exhaust fan 69 could withdraw air from a localized region in workspace 81 through a limited diameter pipe (i.e. to exhaust certain emissions). In turn, an exhaust hose or other similar ductwork could be connected to the coupling for exhaust fans 69 to draw the contaminant air suitably away from enclosure 19. To compensate, or make-up, for the pressure drop in workspace 81 due to the above-described exhausting of contaminant air, a comparable quantity of source air could be introduced into enclosure 19 by intake fans 65.

Automated Control Process 201

As referenced briefly above, controller 99 can be programmed in order to automate the principal operations of system 11. The particular electrical components connected to programmable controller 99 are therefore selected based on the particular parameters of operation that system 11 is designed to support in an automated fashion.

Figure 11:
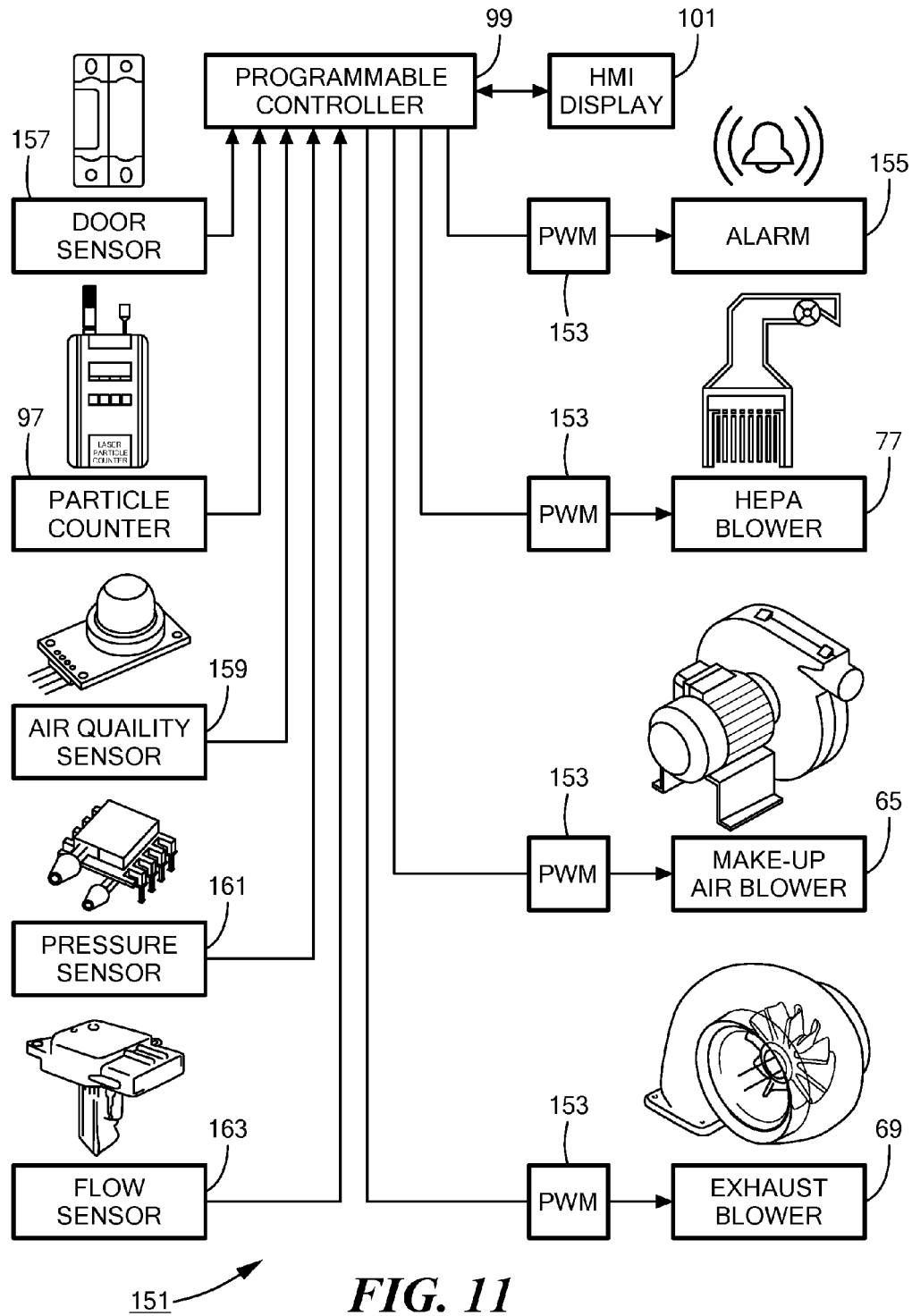
FIG. 11 is a simplified schematic representation of an illustrative set of electrical components that are connected to the programmable controller shown in FIG. 10.

For instance, referring now to FIG. 11, there is shown a simplified schematic representation of an illustrative set of electrical components that are electrically connected to the programmable controller 99 to form an automated control circuit 151. It is to be understood that the particular components included within automated control circuit 151 could be modified to suit the needs of the intended application without departing from the spirit of the present invention.

As can be seen, in automated control circuit 151, programmable controller 99 is electrically connected to each of intake fans 65, exhaust fans 69 and HEPA fans 77 through a pulse-width modulation (PWM) control circuit 153. In this manner, controller 99 is able to regulate the operational speed of fans 65, 69 and 77.

Programmable controller 99 is additionally electrically connected to each of an interactive display 101 and an alarm 155 (via a PWM control circuit 153). As such, controller 99 is able to send and receive relevant operational information to the user of system 11.

Lastly, programmable controller 99 is electrically connected to a set of electrical devices that provide information which can be used to determine the operational efficiency of system 11. Specifically, automated control circuit 151 is shown with programmable controller 99 connected to (i) at least one particle counter 97 for measuring the concentration of airborne particles at designated sampling locations within workspace 81, (ii) at least one door sensor 157 mounted on open frame 35 within an access window 47 for determining if any movable doors 37 are open, (iii) at least one air quality sensor 159 for testing the air within workspace 81 for the presence of any potentially harmful emissions, (iv) at least one air pressure sensor 161 for measuring the air pressure level within a region inside or immediately outside enclosure 19, and (v) at least one flow sensor 163 for measuring the velocity of airflow through workspace 81.

Figure 12:
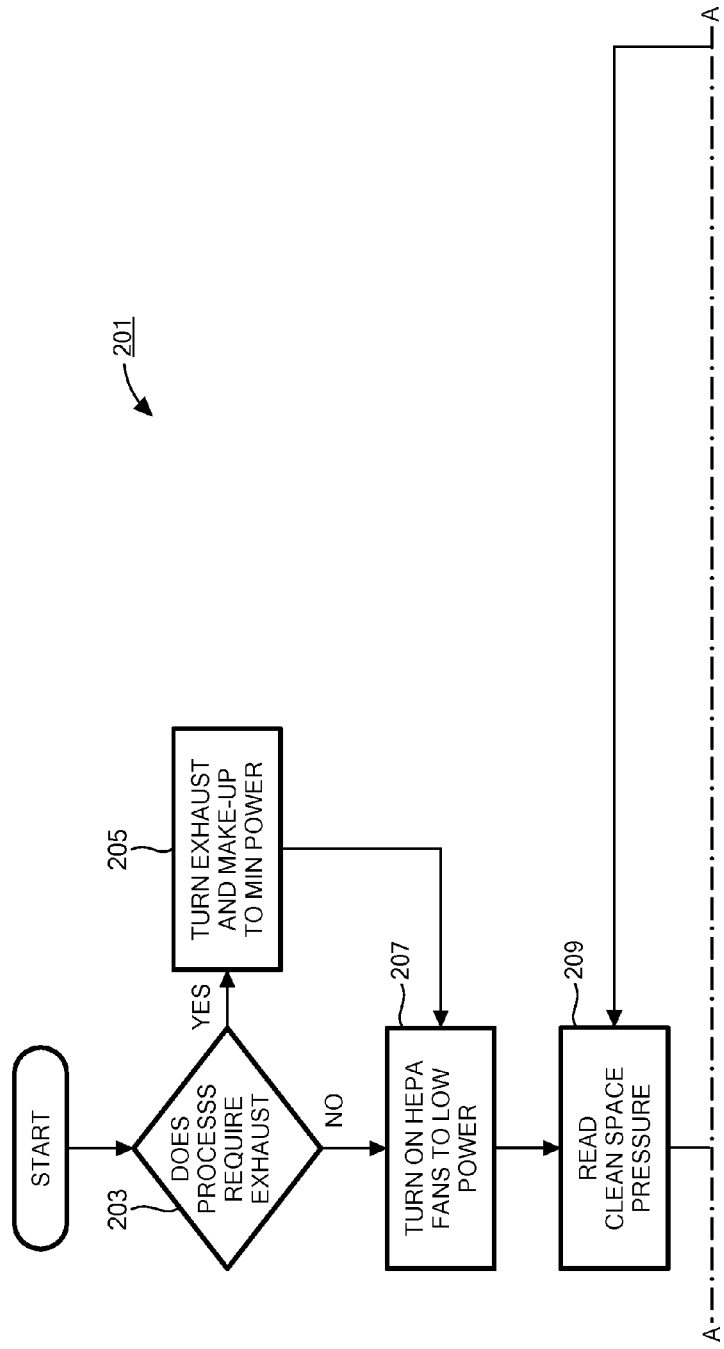
FIG. 12 is a flow chart of an example of an automated process for regulating the operation of the system shown in FIG. 2.
Figure 12:
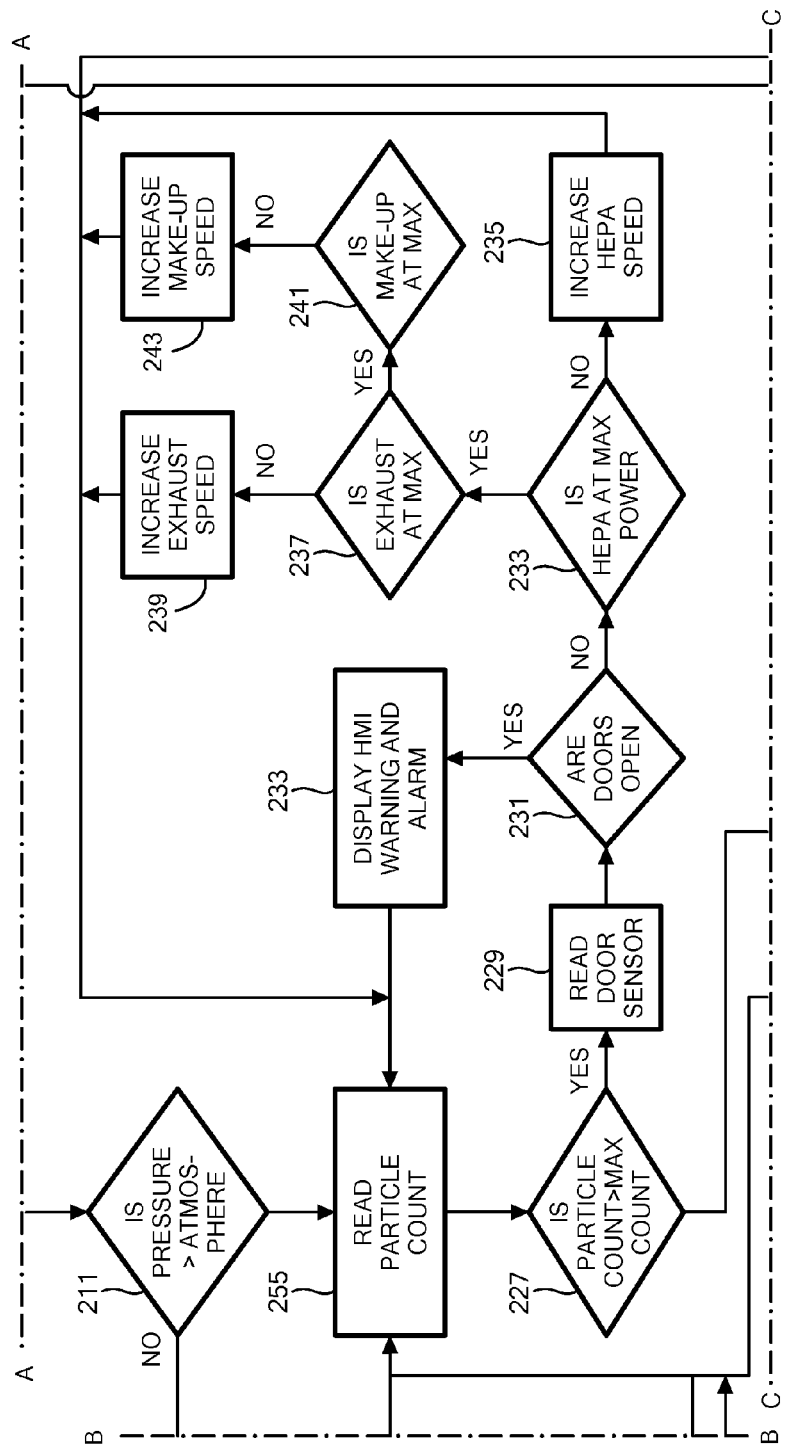
Figure 12:
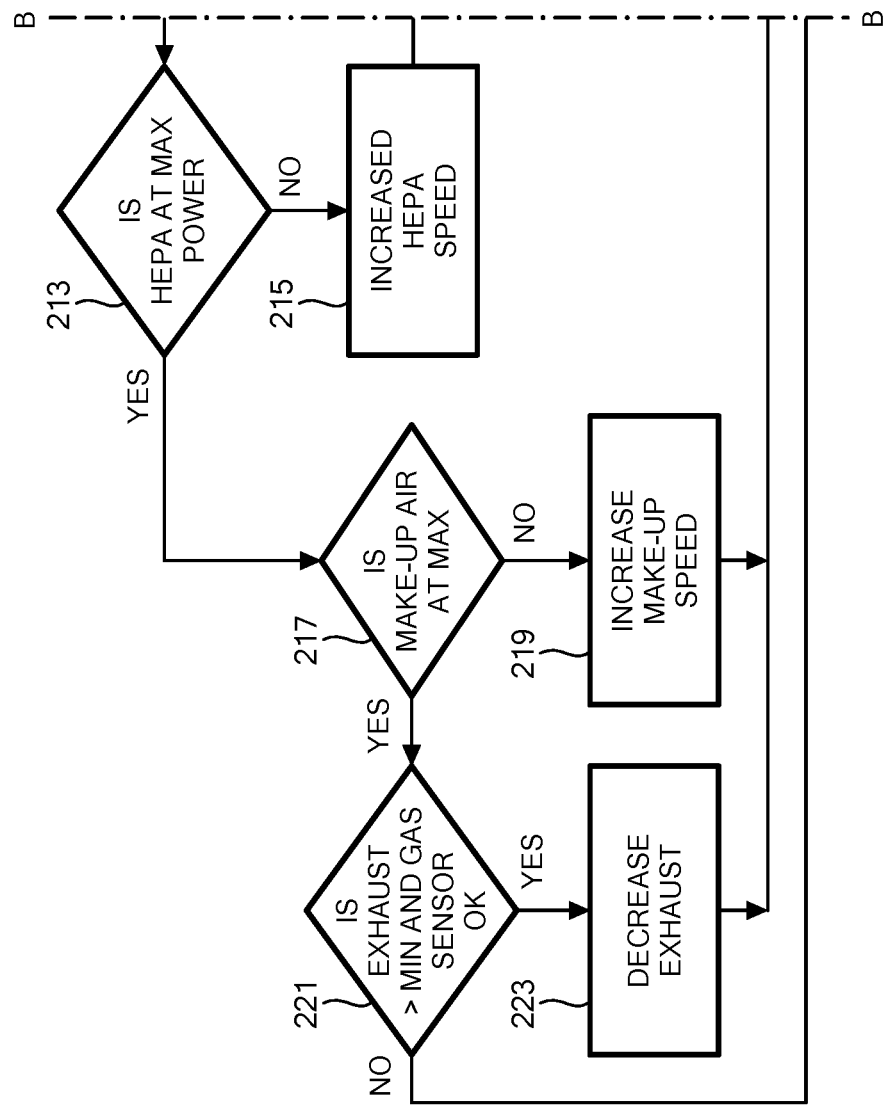
Figure 12:
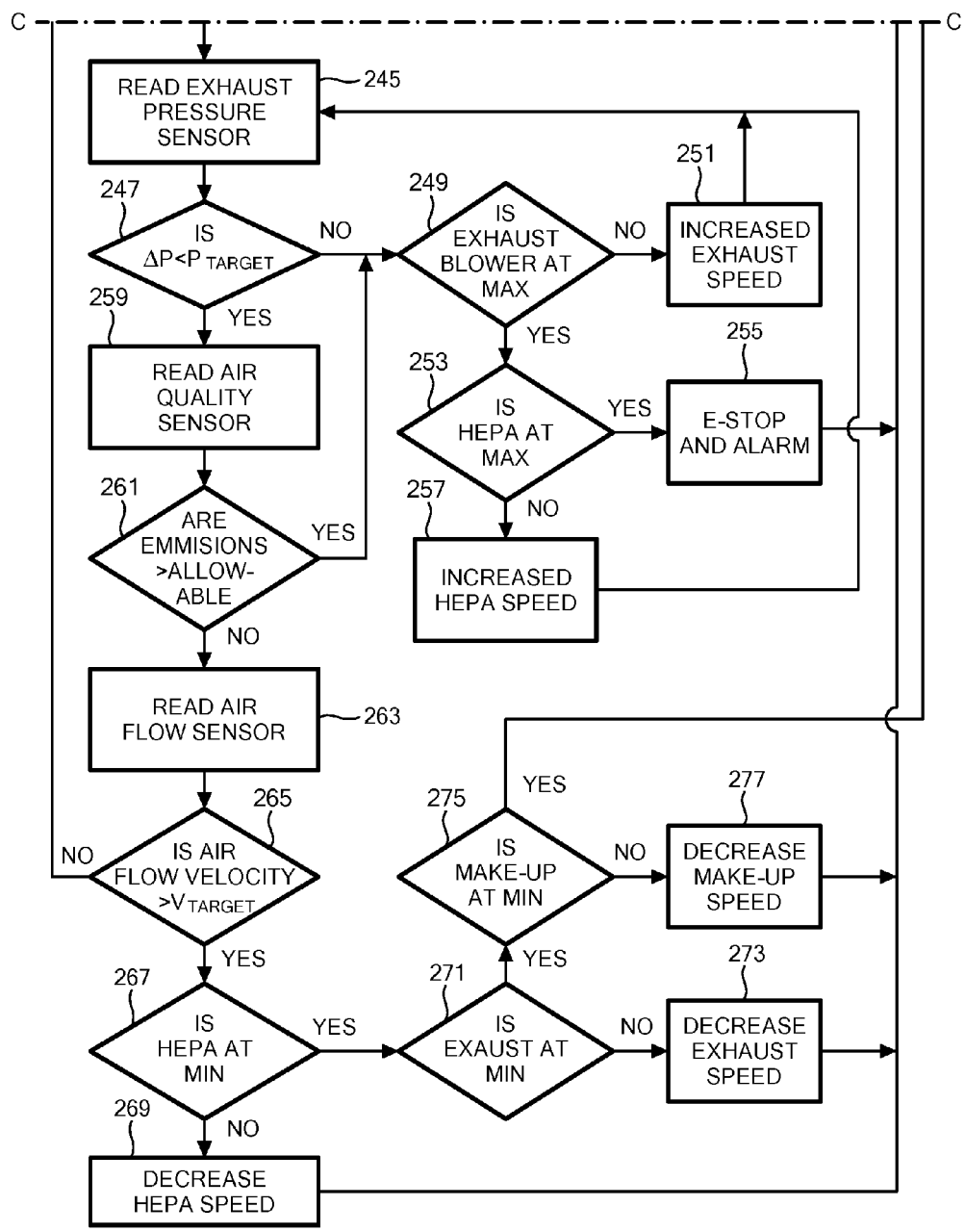

In view thereof, referring now to FIG. 12, there is shown a flow chart depicting an example of an automated control process that can be utilized by control subsystem 25 to regulate operation of system 11, the automated control process being identified generally by reference numeral 201.

It should be noted that the details of automated control process 201 are being provided for illustrative purposes only. Accordingly, it is to be understood that modifications could be made to automated control process 201 (e.g. to suit the needs of the intended application for system 11) without departing from the spirit of the present invention.

As a primary step 203 in process 201, it is determined whether system 11 will require any exhausting of air from a localized area within clean workspace 81. For instance, if a certain fabrication process that is to operate within workspace 81 produces potentially harmful emissions, such as chemical vapors, system 11 is preferably designed to locally extract the emissions from workspace 81 and, in turn, away from the immediate area of the facility through a series of exhaust ducts.

If system 11 requires exhausting of air from workspace 81 for safety purposes, the appropriate exhaust fan 69 is activated at a base, or threshold, setting to locally remove air from the region within workspace 81 that is producing the emissions, as noted by step 205. In concert with the activation of exhaust fan 69, the corresponding intake fan 65 is activated at a similar setting to compensate, or make-up, for air withdrawn from enclosure 19, thereby ensuring that an increased pressure level is maintained within workspace 81.

Upon completion of step 205 or, in the alternative, if system 11 does not require the exhausting of air, process 201 initiates the circulation of clean air through enclosure 19 in step 207 by activating HEPA fans 77 to a base, or low power, setting. As can be appreciated, the low power setting preferably balances producing suitable airflow through enclosure 19 without inefficiently and/or overworking fans 77.

As air circulates through enclosure 19, a primary pressure sensor 161 preferably measures the air pressure within workspace 81, this pressure measurement step being represented by reference numeral 209. The workspace air pressure is then compared against an air pressure reading taken by a pressure sensor 161 located in the immediate environment outside enclosure 19, as shown in step 211. As referenced above, maintaining an increased pressure level within workspace 81 effectively creates a barrier to entry for external air and any particulates present therein.

If the pressure differential between workspace 81 and the immediate outside environment does not meet a predefined threshold, process 201 proceeds to step 213 in order to increase the pressure within workspace 81. In step 213, a determination is made whether HEPA fans 77 are already operating at maximum power. If HEPA fans 77 are not operating at maximum power, the speed of HEPA fans 77 is increased at a defined increment in order to adjust the pressure within workspace 81 to the desired level, as shown in step 215.

If HEPA fans are already operating at maximum power, intake fans and exhaust fans are preferably adjusted to achieve the desired pressure level within workspace 81. Specifically, in step 217, it is first determined whether intake fans 65 are already operating at maximum power. If not operating at maximum power, the speed of intake fans 65 is increased at a defined increment to increase the pressure within workspace 81 to the desired level, as shown in step 219.

If intake fans 65 are already operating at maximum power, it is determined in step 221 whether exhaust fan 69 can be reduced without compromising the quality of the resultant air in workspace 81. If proper air quality can be maintained, the speed of exhaust fans 69 is decreased to the extent necessary to achieve the required pressure level within workspace 81, as represented in step 223.

Once the pressure level within workspace 81 is deemed suitable, a particle count is taken by a particle counter 97 located within clean workspace 81, as represented by step 225. In step 227, the measured particle count is then compared by controller 99 against a defined threshold. If the particle count is considered too high (i.e. above the defined threshold), a series of steps is initiated to improve the air quality within workspace 81.

Specifically, in step 229, door sensors 157 located within selected access windows 47 are read. Using the sensor information, controller 99 determines, in step 231, whether any movable doors 37 are open, which in turn could introduce particulates into workspace 81. If it is determined that doors 37 are open, controller 99 instructs alarm 155 to produce an auditory and/or visual indication that the opened doors 37 are compromising air quality within workspace and, as such, should be closed.

If it is determined that doors 37 are not open, air circulation within enclosure 19 is increased to cycle cleaner air into workspace 81. Specifically, in step 233, it is first determined whether HEPA fans 77 are already operating at maximum power. If HEPA fans 77 are not operating at maximum power, the speed of HEPA fans 77 is increased at a defined increment in order to cycle cleaner air into workspace 81, as shown in step 235.

If HEPA fans 77 are already operating at maximum power, it is determined whether exhaust fans 69 can be increased in order to extract a greater quantity of the polluted air from workspace 81. If exhaust fans 69 are not already operating at maximum power, the speed of exhaust fans 69 is increased to the extent necessary to achieve the required air cleanliness level within workspace 81, as represented in step 239.

If exhaust fans 69 are already operating at maximum power, it is then determined whether intake fans 65 can be increased in order to introduce new air into enclosure 19, as represented by step 241. If not operating at maximum power, the speed of intake fans 65 is increased to the extent necessary to improve the air cleanliness level within workspace 81, as represented in step 243.

Once the concentration of particulates within the air in workspace 81 is deemed suitable, a determination is made whether the air pressure within clean workspace 81 is suitably greater than the air pressure within exhaust 83. As referenced above, maintaining an increased pressure level within workspace 81 relative to exhaust 83 ensures that particles remain within exhaust 83 and do not travel forward within enclosure 19 towards clean workspace 81.

Accordingly, a secondary pressure sensor 161 preferably measures the air pressure within return 83, this pressure measurement step being represented by reference numeral 245. The air pressure in return 83 is then compared by controller 99 against the previously measured air pressure in clean workspace 81, as shown in step 209.

If the pressure differential between workspace 81 and return 83 does not meet a predefined threshold, steps are taken to adjust the pressure differential within enclosure 19. First, a determination is made whether exhaust fans 69 are operating a maximum power, as shown in step 249. If not operating at maximum power, the speed of exhaust fans 69 is incrementally increased, as shown in step 251. By increasing the speed of exhaust fans 69, the pressure within return 83 is correspondingly reduced, thereby raising the pressure differential within enclosure 19. Process 201 then returns to step 245 and the pressure differential within enclosure 19 is re-evaluated to determine its adequacy.

If exhaust fans 69 are already operating at maximum power, a determination is made whether HEPA fans 77 are operating at maximum power, as shown in step 253. If HEPA fans are already operating at maximum power, controller 99 instructs display 107 to produce an auditory and/or visual alarm and return process 201 to step 209.

Otherwise, if not operating at maximum power, the speed of HEPA fans 77 is incrementally increased, as shown in step 257. By increasing the speed of HEPA fans 77, the pressure within clean workspace 81 is correspondingly increased, thereby raising the pressure differential within enclosure 19. Process 201 then returns to step 245 and the pressure differential within enclosure 19 is re-evaluated to determine its adequacy.

Once the air pressure differential within enclosure 19 is considered adequate, a measurement is taken of the air quality in workspace 81 by air quality sensor 159 (e.g. to measure the concentration of chemical vapors), as shown in step 259. Furthermore, in step 261, an evaluation is made whether the measured air quality in workspace 81 meets a defined standard. If deemed inadequate, process 201 proceeds back to step 249 to determine whether the speed of exhaust fans 69 can be increased in order to withdraw the poor quality air from enclosure 19.

If the measured emissions level meets predefined standards, a determination is made whether the airflow velocity within enclosure 19 exceeds a predefined threshold. As can be appreciated, it has been determined that airflow velocity levels which are too high can affect not only the fabrication process undertaken within enclosure 19 (e.g. by distorting highly sensitive thin films) but also the efficiency and longevity of certain components, such as the fan motors. Accordingly, to the extent possible without compromising results, it is always intended that airflow velocity be maintained at moderate levels.

Therefore, an airflow sensor 163 preferably measures the velocity of airflow through enclosure 19, as shown in step 263. In step 265, the airflow measurement is compared against a predefined standard. If the measured airflow velocity runs beneath the predefined threshold, process 201 returns to step 225 for another particle count evaluation.

If the measured airflow velocity is too great, a determination is made in step 267 whether HEPA fans 77 can be reduced (i.e. are above their minimum, or base, setting). If HEPA fans 77 are operating above their minimum speed, HEPA fans 77 are incrementally reduced in step 269 in order to reduce the overall airflow velocity.

Otherwise, if HEPA fans 77 are already operating at their minimum setting, a determination is made in step 271 whether exhaust fans 69 are operating at their minimum setting. If not operating at their minimum setting, the speed of exhaust fans 69 is decreased in step 273 and process returns back to airflow sensor measurement step 263.

If exhaust fans 69 are already operating at their minimum speed, a determination is made in step 275 whether intake fans 65 can be reduced. If intake fans 65 are not operating at their minimum threshold, the speed of intake fans 65 is incrementally reduced in step 277 to improve the overall efficiency of system 11. Otherwise, if the speed of intake fans 65 cannot be reduced, process 201 returns to step 225 for another particle count evaluation.

Actual Test Results Achieved Using System 11

It should be noted that system 11 was constructed in the manner set forth in detail above and, in turn, tested to determine its effectiveness in maintaining a clean workspace. A series of readings taken under varying conditions is detailed below. The following examples are provided for illustrative purposes only and are not intended to limit the scope of the present invention.

EXAMPLE 1

With fans 65, 69 and 77 operating, exterior panels 37 closed, and interior panels 39 removed, the average particle count recorded within selected areas of each module 29 for particles at least 0.5 μm in size was 125.9375. Table 1 below represents the data collected under the aforementioned test conditions.

TABLE 1

| Mode | Condition | Size | Module 29-1 | Module 29-2 | Module 29-3 | Module 29-4 |
|---|---|---|---|---|---|---|
| M | All Doors Closed | 0.5μ | 103 | 97 | 62 | 196 |
|   | No Screens Bottom Left | 0.7μ | 30 | 34 | 27 | 56 |
| M | All Doors Closed | 0.5μ | 64 | 16 | 313 | 134 |
|   | No Screens Bottom Right | 0.7μ | 22 | 3 | 115 | 35 |
| M | All Doors Closed | 0.5μ | 107 | 110 | 57 | 331 |
|   | No Screens Upper Left | 0.7μ | 50 | 31 | 17 | 102 |
| M | All Doors Closed | 0.5μ | 76 | 21 | 148 | 180 |
|   | No Screens Upper Right | 0.7μ | 28 | 8 | 40 | 45 |

EXAMPLE 2

With fans 65, 69 and 77 continuing to operate, exterior panels 37 opened, and interior panels 39 removed, the average particle count recorded within each module 29 for particles at least 0.5 μm in size increased to 978.3125. Table 2 below represents the data collected under the aforementioned test conditions.

TABLE 2

| Mode | Condition | Size | Module 29-1 | Module 29-2 | Module 29-3 | Module 29-4 |
|---|---|---|---|---|---|---|
| M | All Doors Closed | 0.5μ | 103 | 97 | 62 | 196 |
|   | No Screens Bottom Left | 0.7μ | 30 | 34 | 27 | 56 |
| M | All Doors Closed | 0.5μ | 64 | 16 | 313 | 134 |
|   | No Screens Bottom Right | 0.7μ | 22 | 3 | 115 | 35 |
| M | All Doors Closed | 0.5μ | 107 | 110 | 57 | 331 |
|   | No Screens Upper Left | 0.7μ | 50 | 31 | 17 | 102 |
| M | All Doors Closed | 0.5μ | 76 | 21 | 148 | 180 |
|   | No Screens Upper Right | 0.7μ | 28 | 8 | 40 | 45 |

As can be seen, the average particle count from example 1 to example 2 increased by a factor of 7.7, which is indicative of the effectiveness of airtight enclosure 19 in preventing outside contaminants from entering into workspace 81.

EXAMPLE 3

With both exterior and interior panels 37 and 39 installed and positioned closed, all fans 65, 69, and 77 were set to operate at 50% of their maximum speed. After waiting a suitable time period for clean air to circulate through workspace 81, the average particle count recorded within each module 29 for particles at least 0.5 μm in size was 79.5625. Table 3 below represents the data collected under the aforementioned test conditions.

TABLE 3

| Mode | Condition | Size | Module 29-1 | Module 29-2 | Module 29-3 | Module 29-4 |
|---|---|---|---|---|---|---|
| M | All Doors Closed | 0.5μ | 127 | 78 | 9 | 22 |
|   | All Screens Bottom Left | 0.7μ | 64 | 41 | 4 | 11 |
| M | All Doors Closed | 0.5μ | 100 | 69 | 77 | 95 |
|   | All Screens Bottom Right | 0.7μ | 42 | 27 | 40 | 55 |
| M | All Doors Closed | 0.5μ | 103 | 80 | 65 | 46 |
|   | All Screens Upper Left | 0.7μ | 49 | 35 | 38 | 21 |
| M | All Doors Closed | 0.5μ | 105 | 84 | 110 | 103 |
|   | All Screens Upper Right | 0.7μ | 52 | 46 | 59 | 55 |

EXAMPLE 4

With both exterior and interior panels 37 and 39 maintained closed, fans 65, 69, and 77 were set to optimize clean air flow. Specifically, optimized clean air flow was determined to occur when intake and exhaust fans 65 and 69 were set to operate at 50% of their maximum speed and HEPA fans 77 were set to operate at 100% of their maximum speed. After waiting a suitable time period for clean air to repeatedly circulate through workspace 81, all measurements recorded for particles at least 0.5 μm in size fell no greater than under 73. Table 4 below represents the data collected under the aforementioned test conditions.

TABLE 4

| | | HEPA 100% Make-Up 50% Exhaust 50% | | | |
|---|---|---|---|---|---|
| Mode | Condition | Module 29-1 | Module 29-2 | Module 29-3 | Module 29-4 |
| M | All Doors Closed All | 72 | 51 | 17 | 44 |
|   | Screens Bottom Left | 17 | 20 | 6 | 21 |
| M | All Doors Closed All | 55 | 24 | 30 | 66 |
|   | Screens Bottom Right | 21 | 6 | 8 | 22 |
| M | All Doors Closed All | 53 | 35 | 32 | 73 |
|   | Screens Upper Left | 23 | 12 | 12 | 19 |
| M | All Doors Closed All | 63 | 60 | 61 | 25 |
|   | Screens Upper Right | 23 | 22 | 22 | 12 |

EXAMPLE 5

If exterior panels 37 are opened, interior panels 39 remain closed, and fans 65, 69, and 77 operate in the manner set forth in Example 3, the average particle count recorded within each module 29 for particles at least 0.5 μm size increases to 658.5625, which is indicative of the effect of exterior panels 37 in preventing outside contaminants from entering into workspace 81. Table 5 represents the data collected under the aforementioned test conditions.

TABLE 5

| Mode | Condition | Size | Module 29-1 | Module 29-2 | Module 29-3 | Module 29-4 |
|---|---|---|---|---|---|---|
| M | Doors Open All Screens Bottom Left | 0.5μ 0.7μ | 1965 1044 | 726 348 | 35 17 | 222 107 |
| M | Doors Open All Screens Bottom Right | 0.5μ 0.7μ | 170 86 | 1282 693 | 633 310 | 1168 607 |
| M | Doors Open All Screens Upper Left | 0.5μ 0.7μ | 1135 559 | 298 148 | 28 13 | 637 335 |
| M | Doors Open All Screens Upper Right | 0.5μ 0.7μ | 186 102 | 766 402 | 354 183 | 932 453 |

To summarize, system 11 was able to achieve class 10,000 cleanroom standards under all testing conditions. In other words, system 11 was able to maintain, at all times, a clean workspace 81 with no greater than 10,000 particles of at least 0.5 μm size, regardless of whether exterior and interior panels 37 and 39 are positioned open or closed.

With all of panels 37 and 39 positioned closed, system 11 was able to achieve class 1,000 cleanroom standards (i.e. maintain, at all times, a clean workspace 81 with no greater than 1,000 particles of at least 0.5 μm size). Furthermore, with fans 65, 69, and 77 configured to operate at their optimized settings (i.e. with intake and exhaust fans 65 and 67 set to operate at 50% of their maximum speed and HEPA fans 77 set to operate at 100% of their maximum speed), system 11 was able to achieve class 100 cleanroom standards and, in fact, measure particle counts that approach zero. As a result, system 11 is particularly well-suited for a wide range of cleanroom applications across a variety of different industries.

Design Modifications and Alternate Constructions of System 11

It should be noted that the construction of system 11 shown above is intended to be merely exemplary and those skilled in the art shall be able to make numerous variations and modifications to it without departing from the spirit of the present invention. All such variations and modifications are intended to be within the scope of the present invention as defined in the appended claims.

For instance, system 11 is shown delivering clean air as a horizontal, laminar flow in the direction from front 31-1 of enclosure 19 to rear 31-2 of enclosure 19. However, it is to be understood that system 11 could be modified, as needed, to deliver clean air as a horizontal, laminar flow in the direction from rear 31-2 of enclosure 19 to front 31-1 of enclosure 19 without departing from the spirit of the present invention.

Reversing the direction of the flow of clean air would be helpful in preventing contaminants from entering the clean workspace 81 when front exterior and interior panels 37 and 39 are disposed open. However, it is to be understood that modifying system 11 such that the flow of clean air flow is directed forward would not be suitable for use in certain applications. For instance, reversing the clean air flow would render system 11 unsuitable for use in connection with manufacturing processes that result in the creation of chemical vapors, since the continuous forward flow of clean air would result in the emission of chemical vapors directly towards the user, which is highly undesirable.

What is claimed is:

1. A system for maintaining a pollutant controlled workspace, the system comprising:
    (a) an enclosure having a front, a back, a top, a bottom, and a pair of sides that together define a common interior cavity, the pollutant controlled workspace being located within the interior cavity, wherein the enclosure comprises,
        (i) a frame shaped to define at least one access window,
        (ii) one or more air permeable interior panels coupled to the frame within the at least one access window, each of the one or more interior panels includes an air permeable mesh screen with a plurality of openings, and
        (iii) one or more air impermeable exterior panels coupled to the frame within the at least one access window, each of the one or more exterior panels includes an air impermeable pane, the one or more interior and exterior panels together defining a narrow, vertically disposed, airflow channel therebetween,
    (b) an air circulation subsystem for delivering a flow of treated air into the narrow airflow channel; and
    (c) a control subsystem for regulating the flow of treated air delivered by the air circulation subsystem into the narrow airflow channel;
    (d) wherein the treated air passes through the one or more interior panels and travels through the pollutant controlled workspace as a horizontal laminar flow.

2. The system as claimed in claim 1 wherein the at least one access window is selectively enclosed by at least one of the one or more interior panels and the one or more exterior panels.

3. The system as claimed in claim 2 wherein the one or more interior panels and the one or more exterior panels are independently coupled to the frame in a spaced apart, parallel relationship.

4. The system as claimed in claim 3 wherein each of the one or more interior panels and the one or more exterior panels is slidably coupled to the frame.

5. The system as claimed in claim 1 further comprising a back board vertically disposed within enclosure and partitioning the interior cavity into a clean workspace and a return.

6. The system as claimed in claim 5 wherein the back board is shaped to define a plurality of transverse holes, the plurality of transverse holes comprising a plurality of mounting holes, the clean workspace being in fluid communication with the return through the plurality of transverse holes in the back board.

7. The system as claimed in claim 6 wherein the supply of treated air collects a quantity of airborne particles present in the clean workspace and draws the quantity of airborne particles into the return through the plurality of transverse holes in the back board.

8. The system as claimed in claim 7 wherein each of the clean workspace and the return has an air pressure level, the air pressure level within the clean workspace being greater than the air pressure level within the return.

9. The system as claimed in claim 1 wherein the top of the enclosure is shaped to define a horizontally extending plenum in fluid communication with the narrow, vertically disposed, airflow channel.

10. The system as claimed in claim 9 wherein the air circulation subsystem, comprises:
    (a) an intake fan for drawing a supply of source air into the enclosure;

(b) a fan filter unit disposed within the plenum for filtering the supply of source air to yield a supply of treated air, the fan filter unit delivering the supply of treated air into the narrow airflow channel; and (c) an exhaust fan for drawing a supply of air out from the interior cavity of the enclosure.

11. The system as claimed in claim 10 wherein the fan filter unit, comprises:
   (a) a High-Efficiency Particulate Arrestance (HEPA) filter for removing airborne particles from the supply of source air; and
   (b) a HEPA fan for directing the supply of source air through the HEPA filter to produce the supply of treated air, the HEPA fan delivering the supply of treated air into the narrow airflow channel.

12. The system as claimed in claim 11 wherein the control subsystem includes a manual control panel for regulating the flow of treated air delivered by the air circulation subsystem.

13. The system as claimed in claim 12 wherein the manual control panel comprises:
   (a) a first control knob in electrical connection with the intake fan, the first control knob regulating operation of the intake fan;
   (b) a second control knob in electrical connection with the HEPA fan for the fan filter unit, the second control knob regulating operation of the HEPA fan; and
   (c) a third control knob in electrical connection with the exhaust fan, the third control fan regulating operation of the exhaust fan.

14. The system as claimed in claim 11 wherein the control subsystem, comprises:)
   at least one particle counter for compiling a measurement of the number airborne particles present in the clean workspace; and
   (b) a controller in electrical connection with the at least one particle counter, the intake fan, the HEPA fan and the exhaust fan;
   (c) wherein the controller automatically regulates operation of the intake fan, the HEMA fan and the exhaust fan based on the measurement compiled by the at least one particle counter.

15. The system as claimed in claim 14 wherein the control subsystem includes an interactive display in electrical connection with the controller.

\* \* \* \* \*